(12) United States Patent
Mitra et al.

(10) Patent No.: US 7,278,074 B2
(45) Date of Patent: * Oct. 2, 2007

(54) SYSTEM AND SHADOW CIRCUITS WITH OUTPUT JOINING CIRCUIT

(75) Inventors: Subhasish Mitra, Folsom, CA (US); Ming Zhang, Urbana, IL (US); Tak M. Mak, Union City, CA (US); Quan Shi, Beaverton, OR (US); Kee Sup Kim, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 351 days.

This patent is subject to a terminal disclaimer.

(21) Appl. No.: 11/044,826

(22) Filed: Jan. 26, 2005

(65) Prior Publication Data

US 2006/0168489 A1    Jul. 27, 2006

(51) Int. Cl.
*G01R 31/28* (2006.01)
(52) U.S. Cl. ..................................... 714/724
(58) Field of Classification Search ............ None
See application file for complete search history.

(56) References Cited

U.S. PATENT DOCUMENTS

| | | | | |
|---|---|---|---|---|
| 5,068,881 A | * | 11/1991 | Dervisoglu et al. | 377/70 |
| 5,598,120 A | * | 1/1997 | Yurash | 327/202 |
| 6,023,778 A | | 2/2000 | Li | |
| 6,185,710 B1 | * | 2/2001 | Barnhart | 714/727 |
| 6,300,809 B1 | * | 10/2001 | Gregor et al. | 327/200 |
| 6,654,944 B1 | * | 11/2003 | Dike | 716/17 |
| 6,938,225 B2 | * | 8/2005 | Kundu | 716/1 |
| 7,020,819 B2 | * | 3/2006 | Shin | 714/727 |
| 2003/0046643 A1 | | 3/2003 | Ohta et al. | |
| 2003/0145264 A1 | * | 7/2003 | Siegel et al. | 714/726 |
| 2003/0222677 A1 | | 12/2003 | Komaki | |
| 2004/0041610 A1 | * | 3/2004 | Kundu | 327/215 |
| 2006/0005103 A1 | * | 1/2006 | Zhang et al. | 714/758 |
| 2006/0015786 A1 | * | 1/2006 | Mitra et al. | 714/724 |
| 2006/0168487 A1 | * | 7/2006 | Mak et al. | 714/700 |

* cited by examiner

*Primary Examiner*—Guy Lamarre
*Assistant Examiner*—Steven D. Radosevich
(74) *Attorney, Agent, or Firm*—Schwabe, Williamson & Wyatt, P.C.

(57) ABSTRACT

In one embodiment, an apparatus includes a system circuit adapted to generate at a first output terminal a first output signal in response to a data input signal and at least one system clock signal; a shadow circuit adapted to generate at a second output terminal a second output signal in response the data input signal and the at least one system clock signal; and an output joining circuit coupled to at least the first output terminal and the second output terminal.

26 Claims, 18 Drawing Sheets

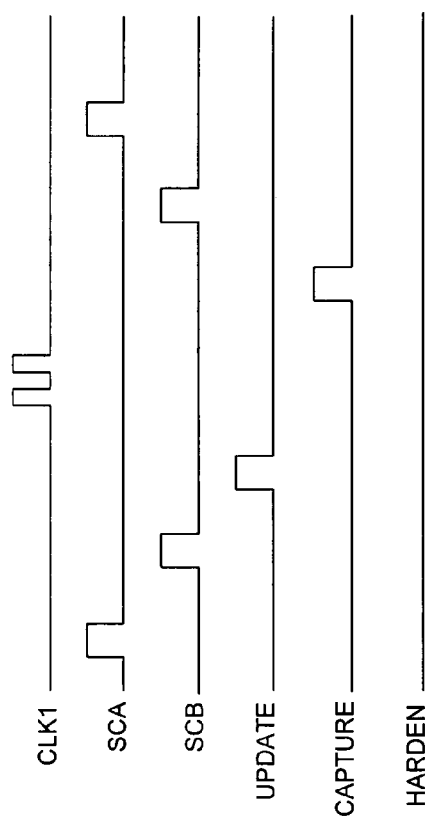
FIG. 7
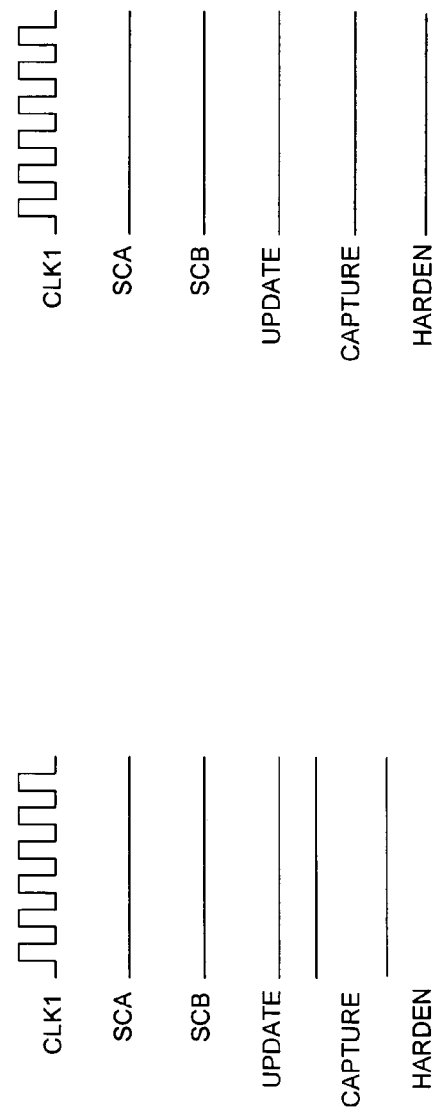
FIG. 8
FIG. 9

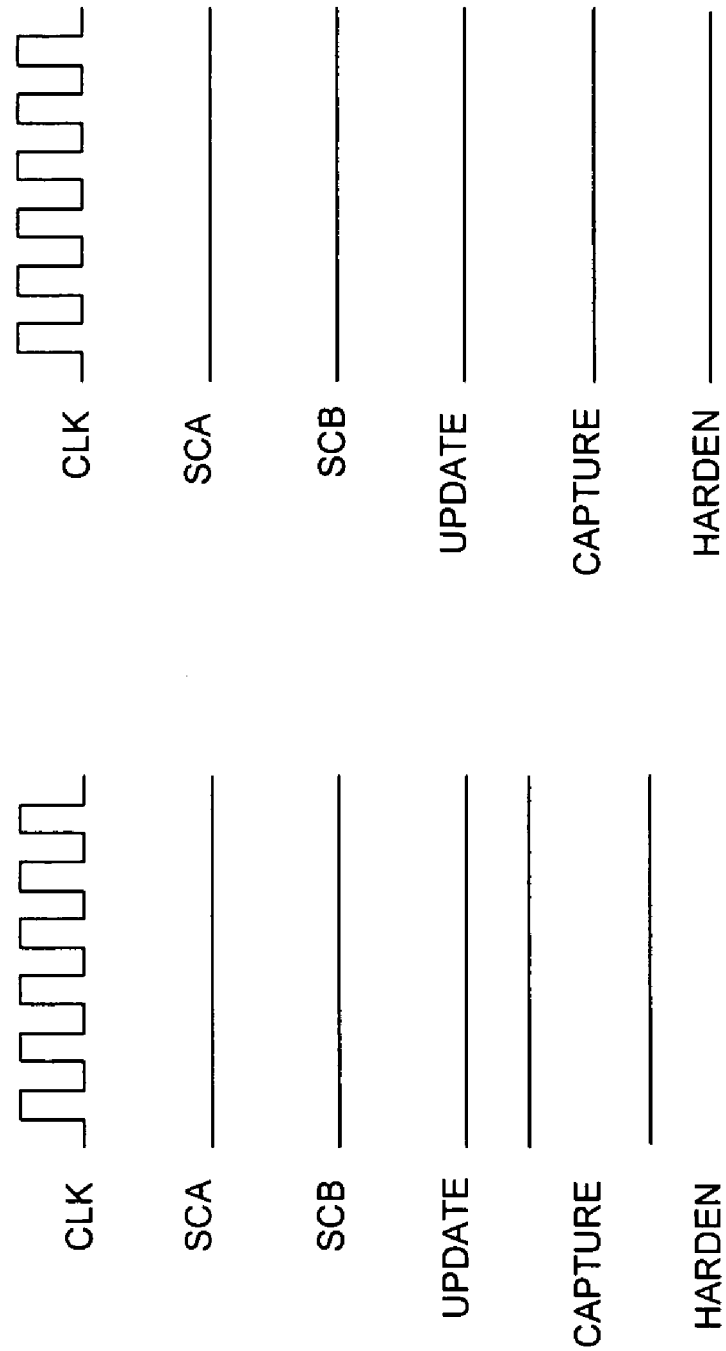

SYSTEM AND SHADOW CIRCUITS WITH OUTPUT JOINING CIRCUIT

BACKGROUND

1. Technical Field

Embodiments of the present invention are related to the field of electronic devices, and in particular, to errors in electronic devices.

2. Description of Related Art

Single event upsets (SEUs), also referred to as soft errors (SERs), are radiation-induced transient errors in digital systems caused by high energy particles such as neutrons generated from cosmic rays and alpha particles from packaging material. For designs manufactured at advanced technology nodes (130 nm, 90 nm, and so on), SEUs are gaining in importance. Hence, soft errors may be significant for microprocessors, network processors, high end routers and network storage components that target enterprise and applications with very high reliability, data integrity and availability. More specifically, bistables (latches and flip-flops) may be major contributors to the system-level soft error rate.

Scan Design-For-Testability (DFT) has become a de facto test standard in the industry because it enables an automated solution to high quality production testing at low cost. In addition, scan DFT may be used for post-silicon debug activities because it provides access to the internal nodes of an integrated circuit. Scan implementations in major high-end microprocessors involve significant circuitry and clock signals that are used only during post-silicon debug and production testing. These resources generally are unused during functional system operation, although they occupy additional area and draw additional leakage power. Scan DFT utilizes scan cells, such as a full-hold, 4-latch scan cell and a 3-latch scan cell for flip-flop based designs or a 2-latch scan cell for latch-based designs.

Referring to FIG. 1, a conventional full-hold scan cell 10 is shown. The scan cell 10 provides a full shadow of the machine state and enables non-intrusive operation while an integrated circuit (IC) chip (not shown) is running or while the system clocks are frozen. The scan cell 10 includes a system flip-flop 12 having a first latch PH2 and a second latch PH1 adapted to receive a data input signal DATA and two phases of a system clock CLK1 and to generate an output signal Q. The cell 10 further includes a scan circuit 14 having a shadow flip-flop 16 with a first latch LA and a second latch LB and interface circuits between the flip-flops 12 and 16. The cell 10 has a test and a functional mode of operation.

Referring to FIG. 2, during the test mode, scan clocks SCA and SCB are applied alternately to the scan cell 10 to shift in (scan in) a test pattern or scan-in signal SI into the latches LA and LB. Next, a signal UPDATE is applied to move the contents of latch LB to latch PH1 so that the test pattern is written into the latch PH1, allowing the test pattern to be applied to a downstream combinational logic circuit (not shown). Next, the inverted clock CLK2 is applied to latch into the latch PH2 a system response to the test pattern received from an upstream combinational logic circuit (not shown), followed by applying the non-inverted CLK1 to move the latched contents of the latch PH2 to the latch PH1. Finally, the signal CAPTURE is applied to move the contents of latch PH1 into latch LA. The system response or scan-out signal SO may now be scanned out by alternately applying clocks SCA and SCB. Referring to FIG. 3, during the functional mode, clocks SCA and SCB and signals CAPTURE and UPDATE are set low, and system clock CLK1 is applied.

BRIEF DESCRIPTION OF THE DRAWINGS

FIG. 7 is a timing diagram for the scan cell of FIG. 6 in its test mode.

FIG. 8 is a timing diagram for the scan cell of FIG. 6 in its resistant functional mode.

FIG. 9 is a timing diagram for the scan cell of FIG. 6 when in its non-resistant functional mode.

FIG. 16 is a timing diagram for the scan cell of FIG. 13 in its resistant functional mode.

FIG. 17 is a timing diagram for the scan cell of FIG. 13 in its non-resistant functional mode.

DETAILED DESCRIPTION OF ILLUSTRATIVE EMBODIMENTS

Figure 1:
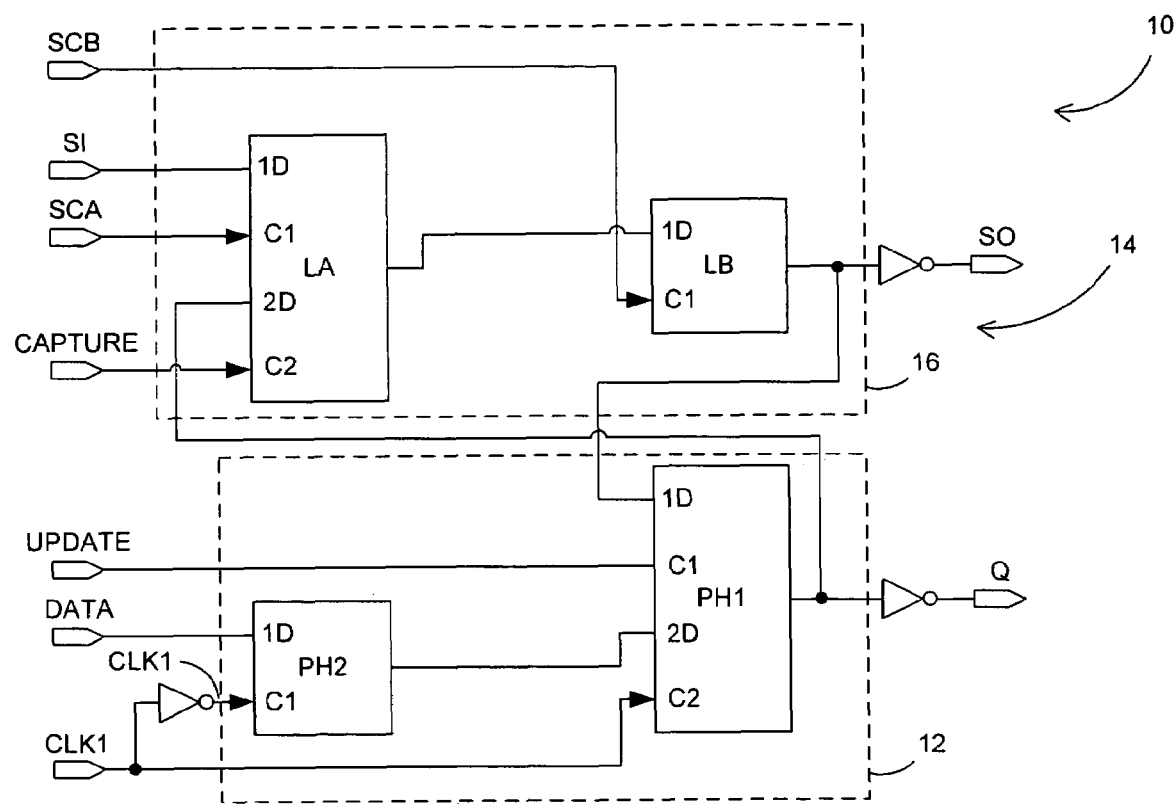
FIG. 1 is a circuit schematic of a conventional full hold scan cell.
Figure 2:
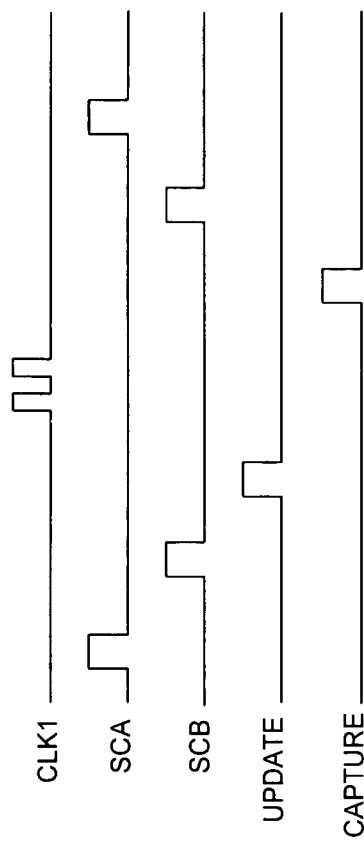
FIG. 2 is a timing diagram for the scan cell of FIG. 1 during its test mode.
Figure 3:
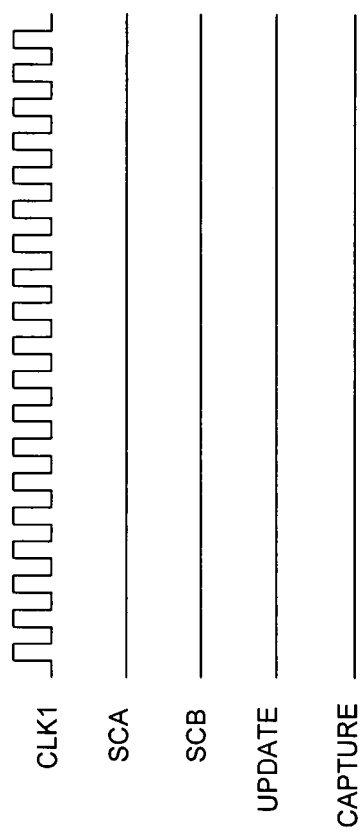
FIG. 3 is a timing diagram for the scan cell of FIG. 1 during its functional mode.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Various embodiments according to the present invention are directed toward protecting sequential circuits (e.g., latches and flip-flops) in an IC chip from soft errors by enabling the sequential circuits with built-in resilience to soft errors. These flip-flops or latches are the general-purpose clocked storage elements that make sequential logic design feasible. In a first group of embodiments according to the present invention, duplication of the sequential circuits is not necessary, because the sequential circuits have already been duplicated for purposes other than providing resilience to soft errors and are not being used during normal (functional) operation. Hence, this first group of embodiments incorporates a "reuse" concept for already duplicated sequential circuits. In a second group of embodiments according to the present invention, a duplication of the sequential circuits (e.g., two latches or two flip-flops) is undertaken for the purpose of providing resilience to soft errors with such duplication not pre-existing in the IC design for other purposes. In both groups of embodiments, soft error resilience may be achieved by incorporating one of two hardening approaches into an output joining circuit coupling the outputs of two sequential circuits: hardening by transmission gate (HDT) or hardening by C-element (HDC).

The first group of embodiments, which incorporate the "reuse" concept, are directed toward scan cells, and more particularly, reuse of scan circuits of the scan cells for providing resilience against soft errors. Each of the scan cells includes a system circuit and a scan circuit with the scan circuit being reused to provide resilience to soft errors. More specifically, these scan cells have two distinct operational modes: a test and a resistant functional mode of operation. In the test mode, the scan cells function the same way as the conventional scan cells of FIG. 1. In the resistant functional mode, by reusing the scan circuit that otherwise would not be used, soft error resilience may be achieved by using the output joining circuit incorporating one of the two hardening approaches HDT and HDC. In addition, in one embodiment, a non-resistant functional mode may be built into the scan cells for power-saving purposes or for other purposes. Hence, in this embodiment, there is both the resistant functional mode (first mode of operation) and a non-resistant functional mode of operation (second functional mode of operation). In one embodiment, in non-resistant functional mode the scan circuit is turned off so that the scan cell consumes power comparable to the system circuit. This non-resistant functional mode provides flexibility, especially for non-critical applications.

These scan cell embodiments adapt and reuse on-chip scan DFT resources (scan circuitry), normally used for production testing and post-silicon debug (but are not used during normal system operation), to achieve built-in resilience to soft errors during normal (functional) system operation. Such radiation-hardened scan cells may provide resilience against soft errors without any performance lost and may achieve significant power and area savings compared to use of existing radiation hardening techniques. The scan cell reuse for hardening may mitigate the soft errors locally without calling system procedures, such as check-pointing or re-execution. Hence, no special recovery mechanisms are used and system availability also may improve since special recovery actions do not need to be invoked upon error detection. Moreover, there may be no latency in error correction. Hardening is effective against most radiations of moderate charge, so the frequency of radiation induced failures is kept to a minimum.

Figure 4:
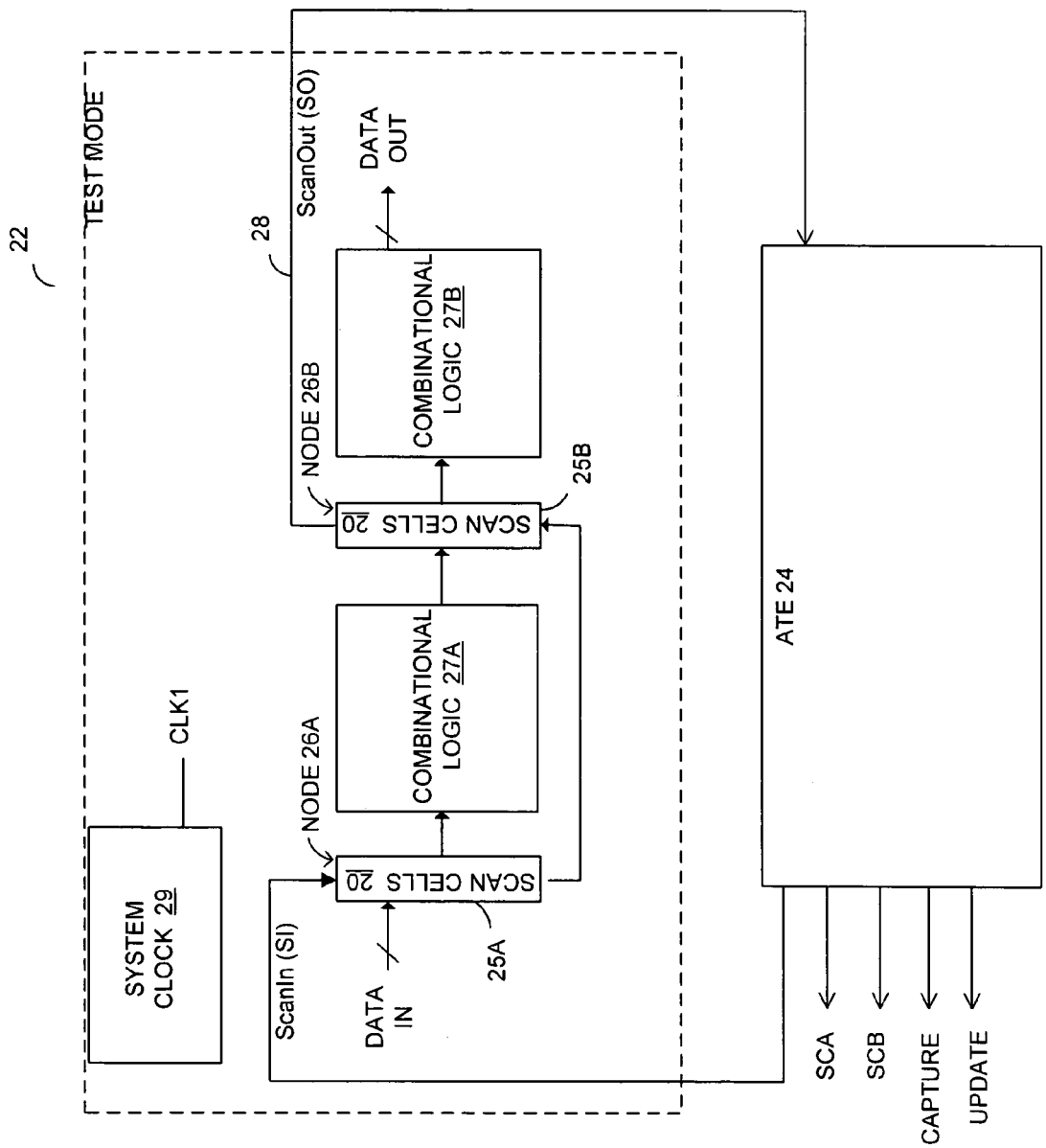
FIG. 4 is a block diagram of an IC chip with its scan cells, according to the various embodiments of the present invention, coupled to an ATE and in a test mode.
Figure 5:
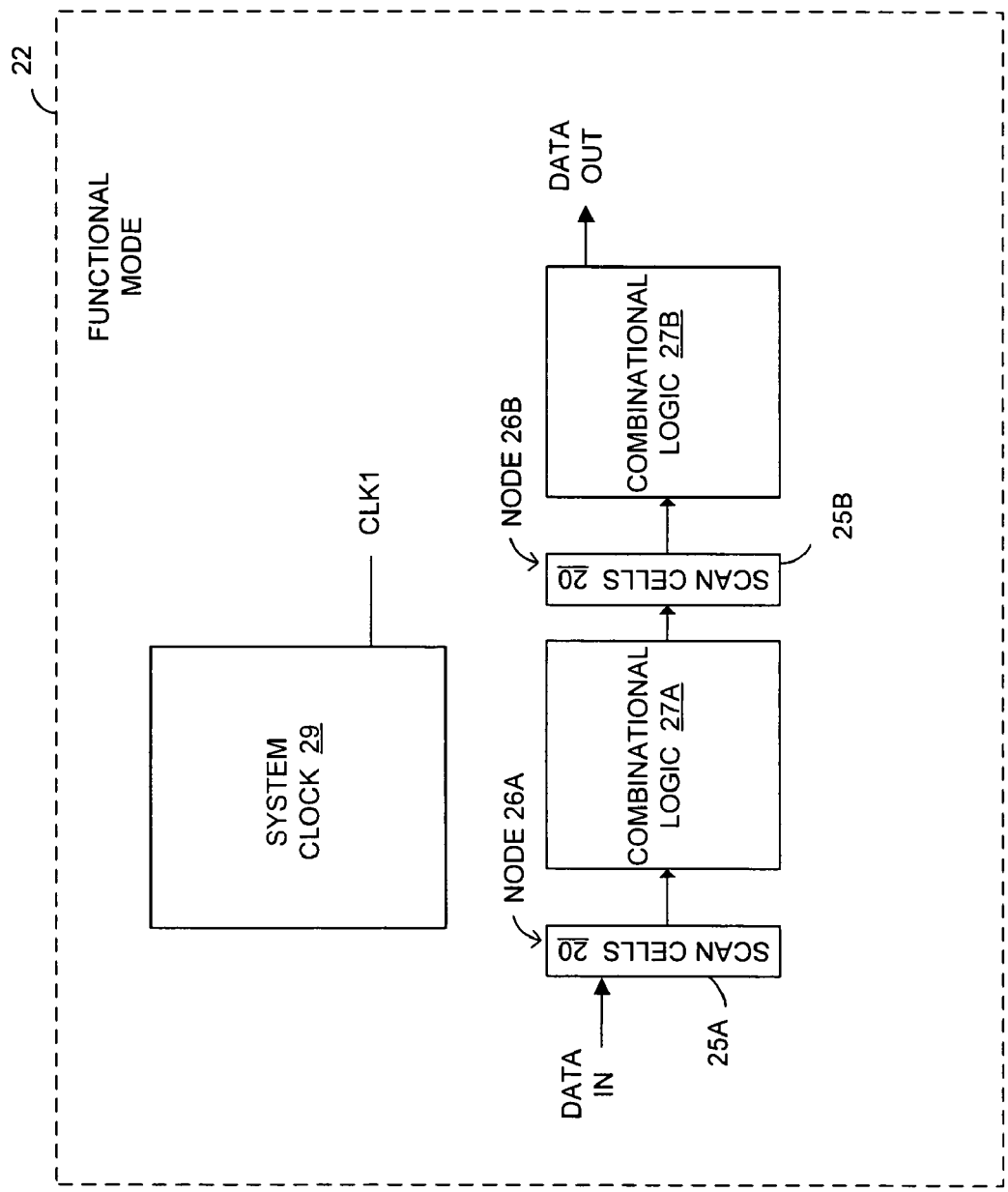
FIG. 5 is a block diagram of the IC chip of FIG. 4 with its scan cells, according to the various embodiments of the present invention, operating in a resistant functional mode.

FIGS. 4 and 5 illustrate the general environment for implementing scan cells 20, according to the scan circuit reuse subgroup of embodiments of the invention. FIG. 4 shows the scan cells 20 in a test mode of operation and FIG. 5 shows the scan cells 20 in a resistant functional mode of operation. For example, each of the scan cells 20 may be a full-hold, 4-latch scan cell or a 3-latch scan cell for flip-flop based designs or may be a 2-latch scan cell for latch-based clocking. Generally, in a flip-flop based designs, flip-flops (which are edge-triggered storage elements) are used in the registers 25. In a latch-based clocking system, latches (which are level-sensitive elements) are used in the registers 25. Regardless of whether flip-flop based or latch-based clocking is utilized, both clocking systems use synchronous clocking approaches wherein the clocks may be utilized to synchronize events among digital components such as flip-flops, latches, multiplexers, adders, and multipliers.

In FIG. 4 an IC chip 22, simplified for illustrative purposes, is shown as a Device-Under-Test (DUT) utilizing scan DFT. The IC chip 22, coupled to an automatic test equipment (ATE) 24, includes registers 25 (two illustrative registers 25A and 25B shown) at nodes 26 (two illustrative nodes 26A and 26B shown) and combinational logic circuits 27 (two illustrative logic circuits 27A and 27B shown) interposed between nodes 26. Each register 25 may be an N-bit-wide clocked register; hence, each register 25 may have N scan cells 20 to receive an N-bit wide, data input signal DATA. Scan DFT avoids the known sequential-test problems by turning flip-flops or latches of the scan cells 20 at input and output nodes 26 of combinational logic circuits 27 into externally loadable and readable elements. During this test mode, these scan cells 20 are chained together as one or more serial shift registers to form a scan path 28. In a scan-in shift operation, serial data of an appropriate test pattern (vector) is loaded into the scan cells 20 to set each of the scan cells 20 to a predetermined state. Once set, the test pattern propagates through the logic circuits 27 to generate a system response to the test pattern. In a capture operation, the scan cells 20 function to latch (capture) the system response. In a scan-out shift operation, the system response is shifted out of the IC chip 22 and analyzed for improper operation. A system clock 29 provides a clock signal CLK1. The ATE 24 provides scan clock signals SCA and SCB and signals CAPTURE and UPDATE, which are used during the test mode for some of the embodiments of scan cell 20 to be described hereinafter (see FIGS. 6 and 10). Subsets of these signals or other signals may be generated by the ATE 24 during the test mode for other embodiments. In FIG. 5 the scan cells 20 in the IC chip 22 are shown configured for their resistant functional mode of operation. In one embodiment, the scan cells 20 also may include a non-resistant functional mode. In this embodiment, FIG. 5 may also represent the configuration of the scan cells 20 during this non-resistant functional mode of operation.

Figure 6:
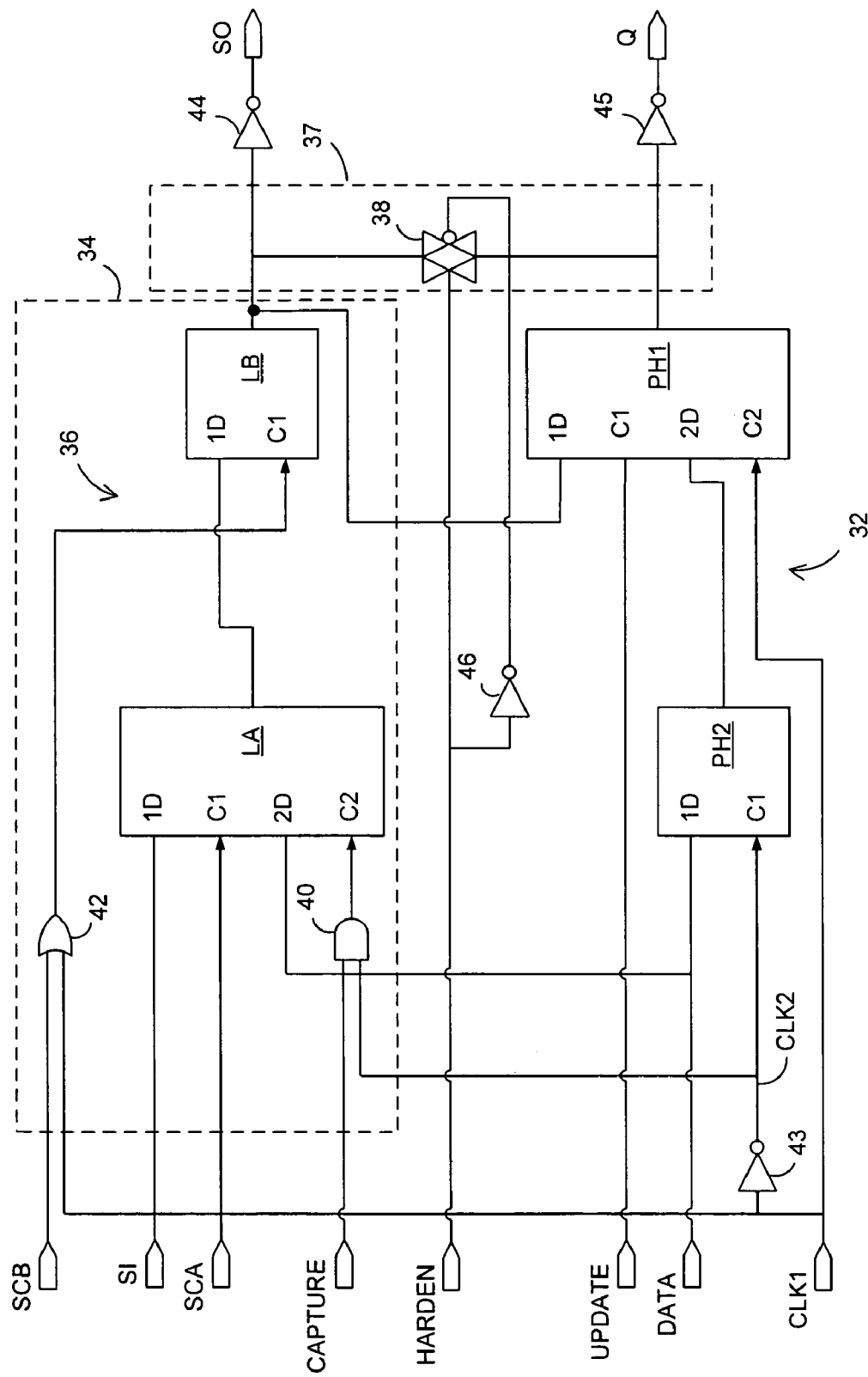
FIG. 6 is a circuit schematic of a full-hold scan cell utilizing hardening by transmission gate (HDT), according to one embodiment of the present invention.

Referring to FIG. 6, the scan cells 20 of FIGS. 4 and 5 may take the form of a full-hold scan cell 30, according to one scan circuit reuse embodiment of the present invention utilizing HDT. The scan cell 30 may include two distinct circuits: a "system circuit" in the form of a system flip-flop 32 and a scan circuit, also referred to as a "shadow circuit" 34. The system flip-flop 32 may include a first system latch PH2 and a second system latch PH1. In one embodiment, the shadow circuit 34 may include a shadow flip-flop 36 having a first shadow latch LA and a second shadow latch LB. The shadow circuit 34 may further include interface circuits between the flip-flops 32 and 36 to be described hereinafter. For the purposes of illustration, the flip-flops 32 and 36 are shown as positive edge-triggered flip-flops using two phases (inverted and non-inverted phases) of the same system clock. However, in another embodiment, two different clock sources may be used for the clock signals CLK1 and CLK2. In another embodiment, the same clock phase may be used with both stages of flip-flops formed by cascading a negative latch (master latch) and a positive latch (slave latch). Likewise, a scan cell may be constructed with negative edge-triggered flip-flops which may be used and constructed according to the same principles.

The scan cell 30 of FIG. 6 may include an output joining circuit 37 in the form of a transmission gate 38 coupled between the outputs of the flip-flops 32 and 36. In one embodiment, the shadow circuit 34 may include a clock control circuit in the form of an AND gate 40 with an output coupled the C2 input of the first shadow latch LA. The shadow circuit 34 may also include an OR gate 42 with an output coupled to the C1 input of the second shadow latch LB. A data input signal DATA is commonly coupled to the 1D input of the first system latch PH2 and the 2D input of first shadow latch LA. The first system latch PH2 also may receive an inverted system clock signal CLK2 (clock CLK1 inverted by an inverter 43) on its C1 input. The second system latch PH1 may receive the non-inverted system clock signal CLK1 on its C2 input, a signal UPDATE on its C1 input, and an output signal from the second shadow latch LB on its 1D input. A signal CAPTURE and the inverted clock signal CLK2 may be inputs to the AND gate 40. The first shadow latch LA also may receive a test pattern (scan-in signal) SI on its test input terminal 1D and a scan clock signal SCA on its C1 terminal. The system clock signal CLK1 and a scan clock signal SCB may be coupled to the input of the OR gate 42. The output signals SO and Q may pass through a pair of inverters 44 and 45. The inverters 44 and 45 may provide a strong and stable driver for the succeeding stage logic. Removing the inverters 44 and 45 does not affect the functionality of the sequential circuits. However, one of the back-to-back inverters inside the latch would then be driving the logic. This may cause noise problems, although there are no logic errors.

The scan cell 30 may have a test mode of operation and a resistant functional mode of operation (first mode of operation) wherein HDT is implemented for error reduction (increased resilience against errors). In one embodiment, the scan cell 30 also may include a second functional mode of operation, which will be referred to as a "non-resistant functional mode", wherein HDT is not implemented (no error reduction) so as to reduce power usage during non-critical applications. The timing diagrams for the test mode, resistant functional mode, and non-resistant functional mode are shown in FIGS. 7, 8, 9, respectively, and will be discussed hereinafter.

The scan cell 30, in addition to adding the transmission gate 38, may include the other structural and routing differences relative to the prior art scan cell of FIG. 1 as hereinafter described. First, the shadow circuit 34 may be modified to include the AND gate 40 (clock control circuit) and the OR gate 42. Second, the shadow circuit 34 may be modified so that the data input signal DATA is commonly fed to the flip-flop 36 (in addition to the flip-flop 32), making it unnecessary to have the output Q of the second system latch PH1 fed back to the input of the first shadow latch LA as is shown in FIG. 1. Third, there may be an additional enable signal HARDEN, which will be described in more detail hereinafter with respect to the resistant and non-resistant functional modes of operation. In the test mode, the enable signal HARDEN may be set to the logic value 0 (low state or low) so that the transmission gate 38 is open and the outputs of the system and shadow flip-flops 32 and 36 are not coupled together. The enable signal HARDEN may be inverted by an inverter 46 so that a non-inverted and an inverted signal HARDEN are provided to the transmission gate 38.

Referring to the timing diagram of FIG. 7, the test mode of operation for the scan cell 30 is similar to that of the prior art scan cell of FIG. 1. The scan clock signals SCA and SCB (left side of diagram of FIG. 7) may be alternately applied to shift a test pattern into the shadow latches LA and LB of the scan cells 30 forming a scan chain (see FIG. 4). Next, with respect to a given scan cell 30, the signal UPDATE may be applied to move the contents of the second shadow latch LB to the second system latch PH1. Thus, a portion of the test pattern (e.g., logic value "0" or "1") has been written into the system flip-flop 32, allowing the portion of the test pattern to be applied to a downstream combinational logic circuit (see FIG. 4). It should be noted that a given scan cell 30 in the scan path (but not at the beginning or end of the scan chain) may not only apply a portion of the test pattern (e.g., logic value "0" or "1") to the downstream combinational logic circuit, but the given scan cell 30 also may latch (capture) a portion of the system response (e.g., logic value "0" or "1") generated by another portion of the test pattern applied to an upstream combinational logic circuit. The signal CAPTURE may be set to allow capture of the portion of the system response from the upstream combinational logic circuit by directly shifting the received portion of the system response into the shadow flip-flop 36. More specifically, the sampling of the received portion of the system response (data input signal DATA) at the 2D input of the shadow latch LA may be triggered by a rising edge of the signal CAPTURE when the inverted system clock signal CLK2 is a logic value 1 (high state or high). Thereafter, the system response from the scan cells 30 in the scan chain may be scanned out (shifted out) of the serially-connected shadow flip-flops 36 by again alternately applying the scan clocks SCA and SCB (right side of diagram of FIG. 7). A scan cell 30 at the beginning of a scan path would only apply a portion of the test pattern (not receive a portion of the system response) and a scan cell 30 at the end of a scan path would only receive a portion of the system response (not apply a portion of the test pattern). The enable signal HARDEN may be kept low during test mode of operation, so that the HDT functionality is in a disabled so as not to interfere with the test mode operation.

Referring to the timing diagram of FIG. 8, the resistant functional mode of operation for the scan cell 30, which implements HDT functionality, is shown. The signals HARDEN and CAPTURE may be both set to a logic value 1 (high). The high signal HARDEN may couple together the two output terminals of the latches LB and PH1 having a first and a second output signal Q and SO, respectively, so as to implement the HDT functionality. Hence, the transmission gate 38 may turn on and tie the outputs of the two flip-flops 32 and 36 together in parallel, to produce a data output signal Q (data output signal SO is the same and redundant). In one embodiment, use of the AND gate 40, with the signal CAPTURE set high, may allow for the accommodation to the non-resistant functional mode, to be discussed hereinafter. During the resistant functional mode of operation, the scan functionality of the shadow circuit 34 may be shut off by asserting zero values for the scan clocks SCA and SCB and the signal UPDATE. The system clock CLK1 (both inverted and non-inverted phases) drives the two flip-flops 32 and 36.

In the resistant functional mode, the system latches PH2 and PH1 comprise a master latch and a slave latch, respectively, in which the output of the master latch PH2 is the input of the slave latch PH1, and the output of the slave latch PH1 provides the output of the system flip-flop 32. When the scan clocks SCA, SCB and signal UPDATE are forced low and the CAPTURE signal is forced high, the first shadow latch LA and the second shadow latch LB of the shadow flip-flop 36 are converted to master and slave latches, respectively. The shadow master-slave flip-flop 36 may work in parallel with the master-slave system flip-flop 32, as the scan clocks SCA and SCB remain static. As a result, the scan cell 30 may not increase the number of timing-critical signals; hence, it may have little, if any, impact on system level design.

When the two outputs of the flip-flops 32 and 36 are coupled together, use of the transmission gate 38 may mitigate soft errors. More specifically, the node capacitance and transistor drive at the output nodes increase, which in turn results in a reduction in SER. First, the more capacitance there is, the more difficult it is to disturb the initial state of the impacted latch. More specifically, when the soft error particle impacts the latch, it charges or discharges the capacitance. The more capacitance there is for the initial state of the latch, the longer it takes to disturb the initial state; therefore, it is harder to corrupt the initial state and the less likely the initial state will change. Second, there are two transistors or gates trying to hold the initial state. Also, it should be noted that under the assumption of a "single" event upset (SEU), a particle strike can at most flip the contents of one bistable in either the system flip-flop 32 or the shadow flip-flop 36, but never both. Hence, with this assumption, at least one correct copy of the system data remains inside the scan cell 30.

Referring to FIG. 9, in one embodiment, the scan cell 30 may also have a non-resistant functional mode which may save power. During non-resistant functional mode, both the signals HARDEN and CAPTURE are low. The low signal HARDEN opens the transmission gate 38 to prevent the outputs of flip-flops 32 and 36 from being tied together. The low signal CAPTURE, when ANDed with the inverted system clock CLK2, prevents the system clock CLK2 from toggling the first shadow latch LA, which may save power. As with the resistant functional mode, in the non-resistant functional mode, the scan clocks SCA and SCB and the signal UPDATE may be set to low. Hence, the system clock CLK1 only drives the system flip-flop 32 and not the shadow flip-flop 36 during the non-resistant functional mode. In another embodiment having the test mode and resistant functional mode with HDT functionality, the non-resistant functional mode may be eliminated.

In summary, the full-hold scan cell 30 with HDT functionality, according to one scan circuit reuse embodiment of the present invention, may be broadly defined to include the "system circuit" in the form of the system flip-flop 32; the "shadow circuit" 34 having the shadow flip-flop 36 and the interfacing circuits between the flip-flops 32 and 36; and an "output joining circuit" 37, in the form of the transmission gate 38, coupled between the outputs of the flip-flops 32 and 36.

Figure 10:
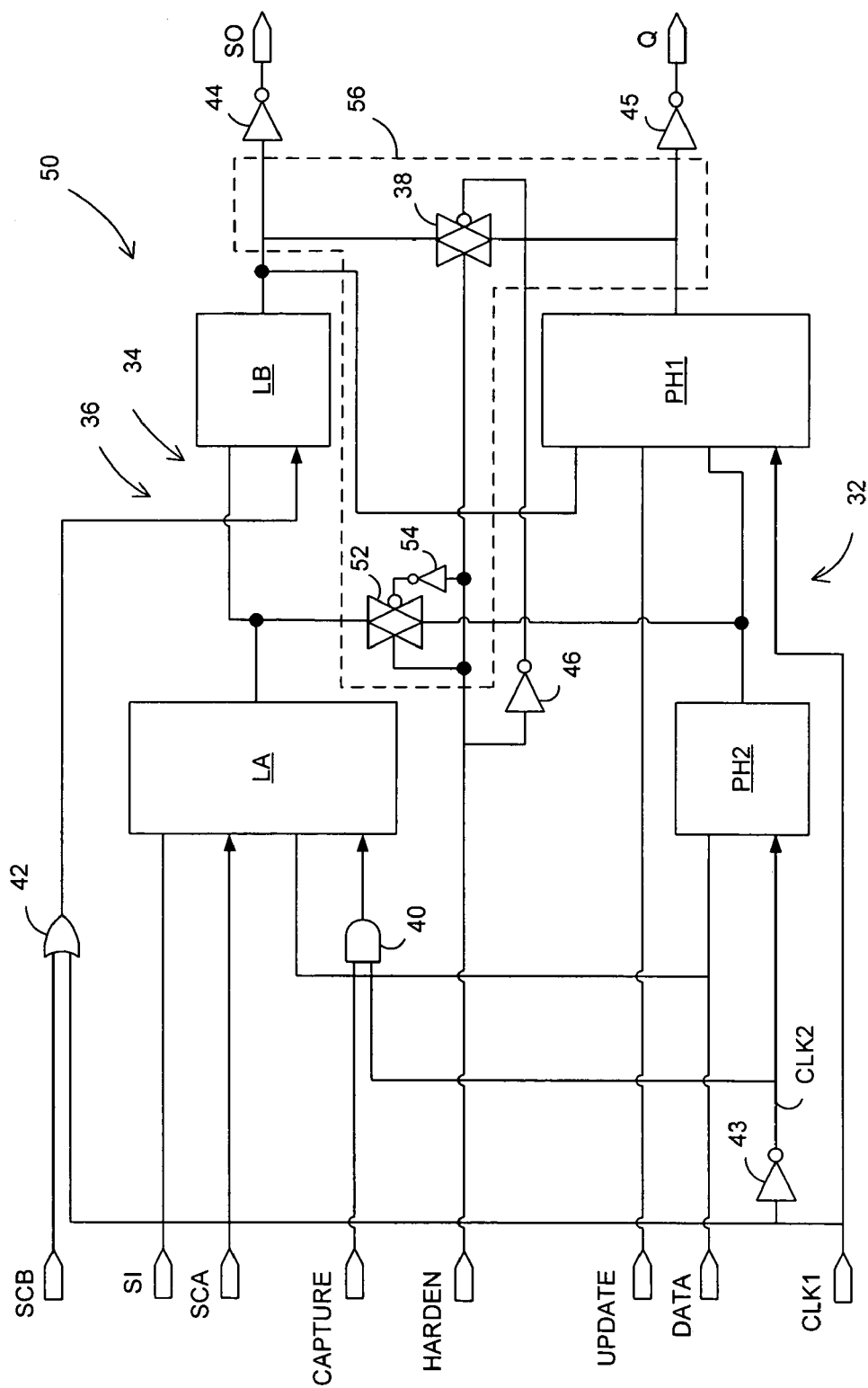
FIG. 10 is a circuit schematic of a full-hold scan cell utilizing HDT, according to another embodiment of the present invention.

Referring to FIG. 10, the scan cells 20 of FIGS. 4 and 5 may take the form of a full-hold scan cell 50 with HDT functionality, according to another scan circuit reuse embodiment of the present invention. The components of the full-hold scan cell 50 remain the same as the full-hold scan cell 30, except that a second transmission gate 52 may be added to couple the outputs of the first system latch PH2 and the first shadow latch LA. The signal HARDEN and an inverted signal HARDEN (inverted by an inverter 54) also may be coupled to the second transmission gate 52. Hence, an output joining circuit 56 may take the form of the first and second transmission gates 38 and 52. The components in the scan cell 50 which are the same as the components in scan cell 30 of FIG. 6 retain the same reference numbers as shown in the scan cell 30 of FIG. 6. In one embodiment, the inverters 46 and 54 can be shared. The operation of the three modes are the same as described with respect to the scan cell 30 of FIG. 6 and the timing diagrams of FIGS. 7-9 are also applicable to the scan cell 50; hence, they will not be described again.

In summary, the full-hold scan cell 50 with HDT functionality, according to another scan circuit reuse embodiment of the present invention, may be broadly defined to include the "system circuit" in the form of the system flip-flop 32; the "shadow circuit" 34 having the shadow flip-flop 36 and the interfacing circuits between the flip-flops 32 and 36; and an "output joining circuit" 56 in the form of the transmission gates 38 and 52.

Figure 11:
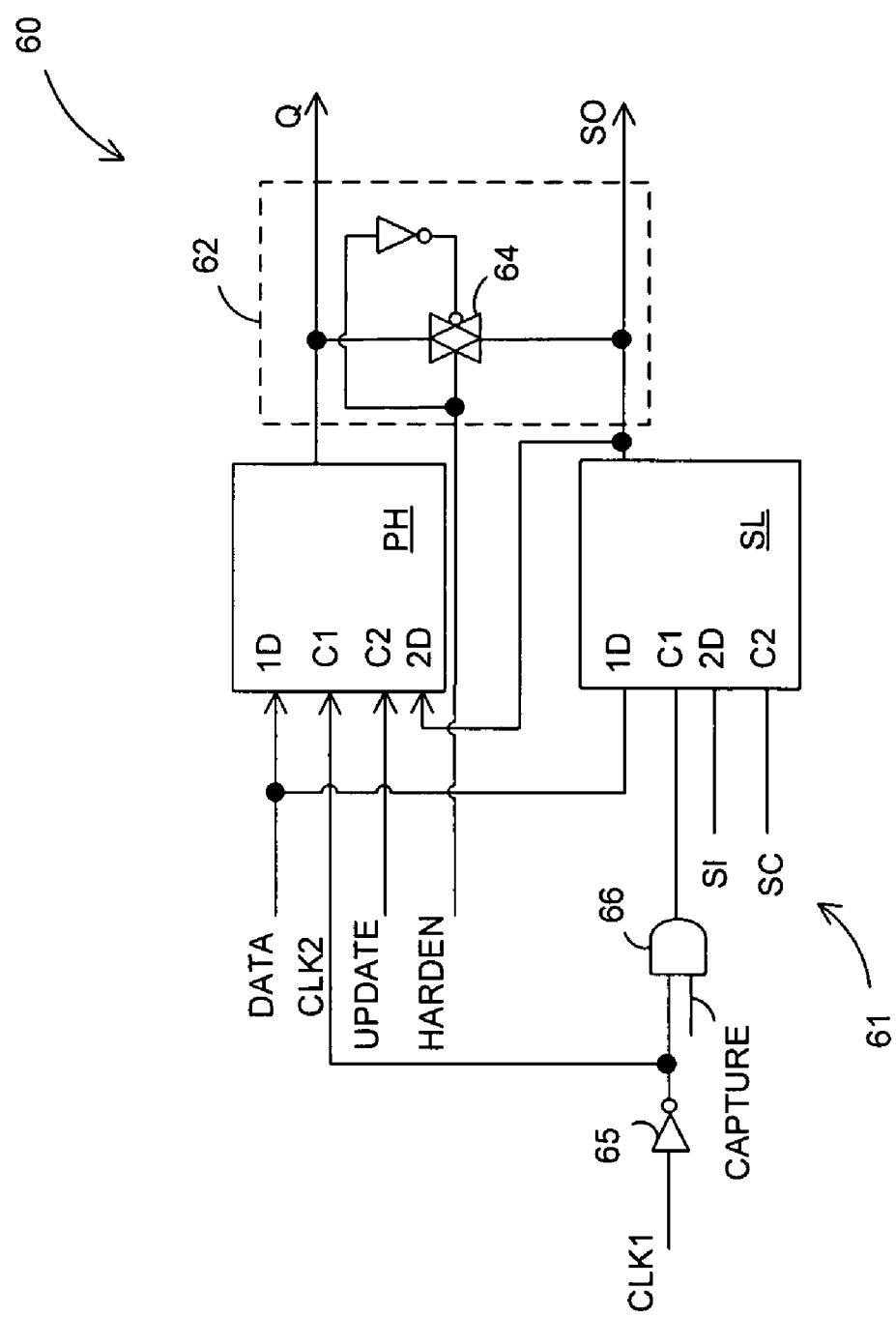
FIG. 11 is a circuit schematic of a 2-latch scan cell for a latch-based clocking utilizing HDT, according to another embodiment of the present invention.

Referring to FIG. 11, each of the scan cells 20 shown in FIGS. 4 and 5 may take the form of a 2-latch scan cell 60 incorporating HDT functionality, according to another scan circuit reuse embodiment of the present invention. The 2-latch scan cell 60 is similar to the 4-latch scan cell 30 of FIG. 6, except the IC chip 22 of FIGS. 4 and 5 using the scan cells 60 is implemented with a latch-based design instead of a flip-flop based design. In other words, the combinational logic circuits of FIGS. 4 and 5 are separated by transparent latches instead of flip-flops, as explained with respect to FIG. 4. The scan cell 60 may include a system circuit in the form of a system latch PH and a shadow circuit 61 having a shadow latch SL and the interfacing circuits between the shadow latch SL and the system latch PH. An output joining circuit 62 in the form of a transmission gate 64 is coupled between the outputs of the system latch PH and the shadow latch SL.

The system latch PH may have inputs of a data input signal DATA, a signal UPDATE, an inverted clock signal CLK2 provided from an inverter 65 receiving the clock signal CLK1, and a Q output of the shadow latch SL. A clock control circuit in the form of an AND gate 66 may have as an input the inverted clock signal CLK2 and a CAPTURE signal and may have an output coupled to the shadow latch SL. The shadow latch SL may have inputs of the data input signal DATA, an output from the AND gate 66, a test pattern (scan-in signal SI), and a scan clock signal SC. The transmission gate 64 may be opened and closed in response to an enable signal HARDEN. The system latch PH has a first output signal Q and the shadow latch SL has a second output signal SO (scan-out signal).

The cell 60 has a test mode and a resistant functional mode of operation. The resistant functional mode may operate with additional resilience against errors. The input signals may operate the latches PH and SL in a similar manner as the same named signals described with respect to FIG. 6. Briefly, during the test mode, the scan clock SC may clock in the test pattern into the shadow latch SL, the signal UPDATE may move it to the system latch PH so as to apply the test pattern to a downstream combinational circuit (see FIG. 4). The system response from an upstream combinational circuit may be fed to both latches PH and SL as the data input signal DATA with the signal CAPTURE high. The scan clock SC then may be used to scan out the system response from the shadow latch SL. In the resistant functional mode, the transmission gate 64 couples the two outputs to provide error reduction by setting the signal HARDEN to high. In one embodiment, the scan cell 60 may have a non-resistant functional mode. This may be accomplished by setting the signal HARDEN low so that the transmission gate 64 is open and by setting the CAPTURE signal low so that the shadow latch SL is not clocked; hence, power may be saved.

In summary, the 2-latch scan cell 60 with HDT functionality, according to another scan circuit reuse embodiment of the present invention, may be broadly defined to include the "system circuit" in the form of the system latch PH; the "shadow circuit" 61 having the shadow latch SL and the interfacing circuits between the system latch PH and the shadow latch SL; and the "output joining circuit" 62 in the form of the transmission gate 64.

Figure 12:
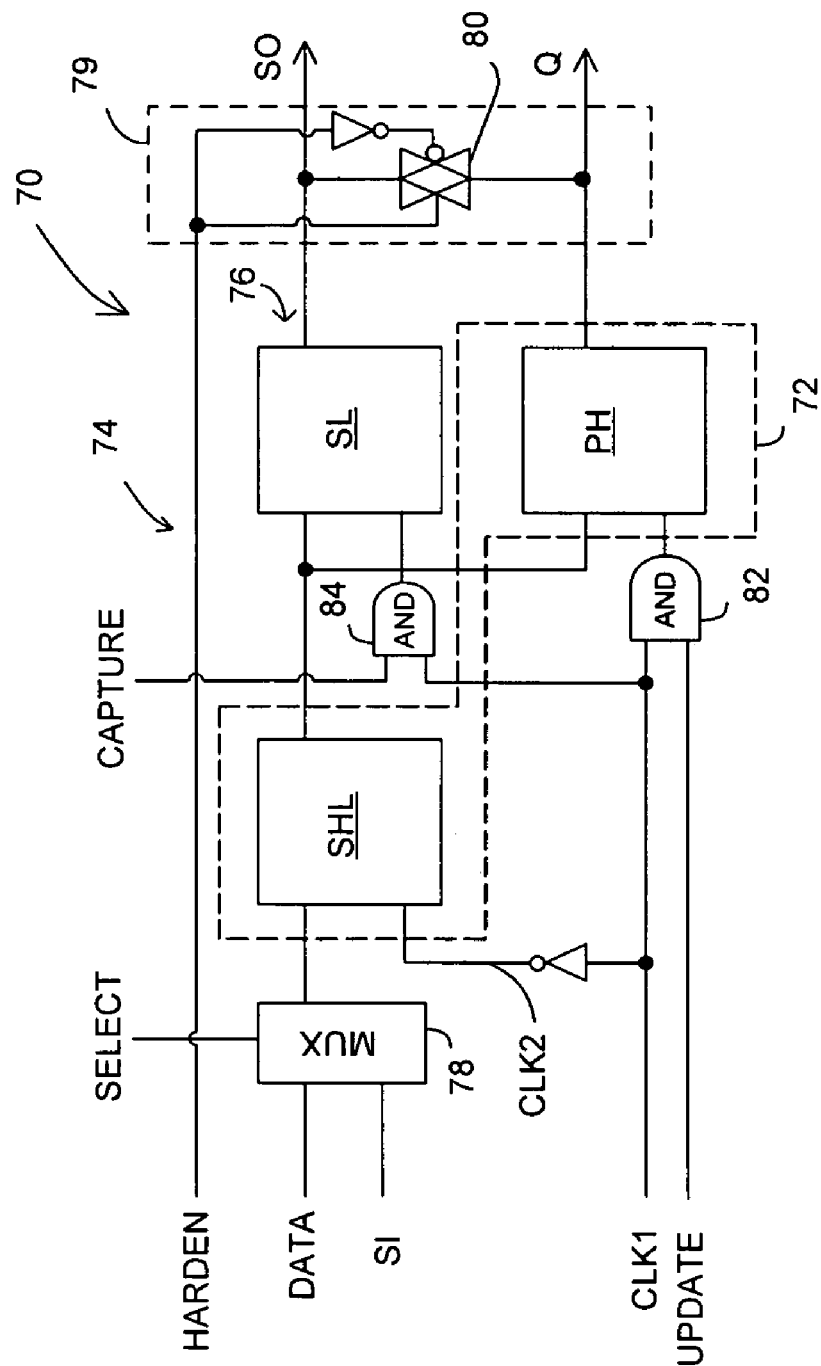
FIG. 12 is a circuit schematic of a 3-latch scan cell utilizing HDT, according to another embodiment of the present invention.

Referring to FIG. 12, each of the scan cells 20 of FIGS. 4 and 5 may take the form of a 3-latch scan cell 70 with HDT functionality, in accordance with another scan circuit reuse embodiment of the present invention. The scan cell 70 is used in an IC with flip-flop based designs. The scan cell 70 may have three latches: a shared latch SHL (master latch), a system latch PH (first slave latch) and a shadow latch SL (second slave latch). In this embodiment, the system circuit may include the shared latch SHL when a signal SELECT selects as an input a data input signal DATA and the system latch PH, which combine to form a system flip-flop 72. A shadow circuit 74 may include the shared latch SHL when the signal SELECT selects as an input a test pattern (scan-in signal) SI and the shadow latch SL, which combine to form a shadow flip-flop 76. The scan cell 70 may include a multiplexer 78 for receiving the data input signal DATA and the scan-in signal SI, which functions as a selector for selecting one of the signals in response to the signal SELECT. The shadow circuit 74 may also include the associated interface circuits between the system flip-flop 72 and the shadow flip-flop 76. The scan cell 70 may be viewed as having two slave latches, which includes the system latch PH and the shadow latch SL. In comparison to the full-hold scan cell 10 of FIG. 6 with two master latches, the scan cell 70 has one master latch SHL. By use of multiplexing, the two master latches may be viewed as being merged into a single master latch SHL. Hence, the 3-latch scan cell 70 may be referred to as a partial-hold or half-hold scan cell. However, in other embodiments, 3-latch scan cells may take many different forms, including for example 3-latch scan cells having two master latches and one slave latch.

An output joining circuit 79 in the form of a transmission gate 80 couples (coupling enable state) and decouples (coupling disable state) the first and the second outputs of the system latch PH and the shadow latch SL, respectively, in accordance with an enable signal HARDEN. An AND gate 82 may have as inputs the non-inverted system clock CLK1 and a signal UPDATE and may provide a clocking output signal to the system latch PH. An AND gate 84 may have as inputs a non-inverted system clock CLK1 and a signal CAPTURE and may provide a clocking output signal to the shadow latch SL. Consequently, the output of the AND gate 82 may clock the system latch PH and the output of the AND gate 84 may clock the slave latch SL. The output terminal of the system latch PH may provide a first output signal (which in this embodiment also becomes the data signal output Q) and the output terminal of the shadow latch SL may provide a second output signal SO (scan-out signal). When the signals CAPTURE or UPDATE is low, the output of the AND gate 82 or AND gate 84 is low no matter whether the clock signal CLK1 is high or low. Accordingly, even though the output of the shared latch SHL is successively changed, the system latch SL or the shared latch PH keeps its last latched value ("1" or "0") while the signal CAPTURE or UPDATE, respectively, remains low. When the signal CAPTURE or UPDATE is high, then the latch PH or latch SL, respectively, is clocked to latch the output of the shared latch SHL.

During a test mode of operation, at an upstream scan cell 70, the signal HARDEN may be set to low so that the transmission gate 80 does not coupled the two outputs together. In a scan-in operation (shift operation), the SELECT signal may be set to cause the multiplexer 78 to select the scan-in signal to load a test pattern. The signal CAPTURE may be set high so the test pattern may be shifted into the shadow latch SL. Hence, the scan cell 70 is configured to have the shadow flip-flop 76. The shadow flip-flops 76 of the scan cells 70 are formed into a scan chain. Also, the signal UPDATE may be set low so that the system latch PH does not toggle and waste power during the shifting operation. Repeated clock cycles of the clock CLK1 shift the test pattern into place throughout the scan chain, with the test pattern propagating through the combinational logic circuits to generate the system response (if the signal UPDATE is set high). Next, in a capture operation, the SELECT signal may select data input signal DATA as an input for the shared latch SHL. The signal UPDATE may be set high so that the system latch PH may latch the output of the shared latch SHL. Hence, the scan cell 70 is configured to form the system flip-flop 72. The signal CAPTURE also may be set high. Consequently, both latches SL and PH may latch the response of the shared latch SHL. Generally, in one clock cycle, the system response may be captured. Next, another shift operation may be performed to scan out the system response. The two phases of the system clock CKL1 may be used to scan out the system response (no separate scan clock signals are generated by the ATE 24 of FIG. 1).

In the resistant functional mode of operation, the multiplexer 78 may be set to select the DATA input, the signals UPDATE, HARDEN, and CAPTURE may be set high. The shared latch SHL may latch the selected data input signal DATA from the multiplexer 78 in accordance with an inverted clock signal CLK2. Both the system latch PH and shadow latch SL capture the output of the shared latch SHL in accordance with the non-inverted system clock signal CLK1. The output terminal of the system latch PH may provide a first output signal (in this embodiment, also the data signal output Q) and the output terminal of the shadow latch SL may provide a second output signal SO (scan-out signal), with the first and second output signals being the same. The first and second outputs Q and SO may be coupled together by the transmission gate 80 to reduce the number of soft errors.

Unlike the previously described embodiments, the 3-latch scan cell 70, once reused for hardening, may only provide protection during half of the clock cycle. For example, when CLK1=0, the latches PH and SL are holding independent state values and are cut off from the master latch SHL. At this point, if an error occurred to either latch PH or the latch SL, the HDT mechanism may provide protection. However, if an error occurs to the shared latch SHL when CLK1=1, there is essentially no protection, because both the latch PH and the latch SL are being driven by the shared latch SHL.

In the non-resistant functional mode of operation, the multiplexer 78 may be set to select the data input signal DATA, the signal UPDATE may be set high, but the signals HARDEN and CAPTURE may be set low so that the shadow latch SL is not latched and the first and second outputs are not coupled together.

In summary, the 3-latch scan cell 70 with HDT functionality, according to another scan circuit reuse embodiment of the present invention, may be broadly defined to include the "system circuit" in the form of the system flip-flop 72; the "shadow circuit" 74 having the shadow flip-flop 76 and the interfacing circuits between the flip-flops 72 and 76; and the "output joining circuit" 79 in the form of the transmission gate 80.

Figure 13:
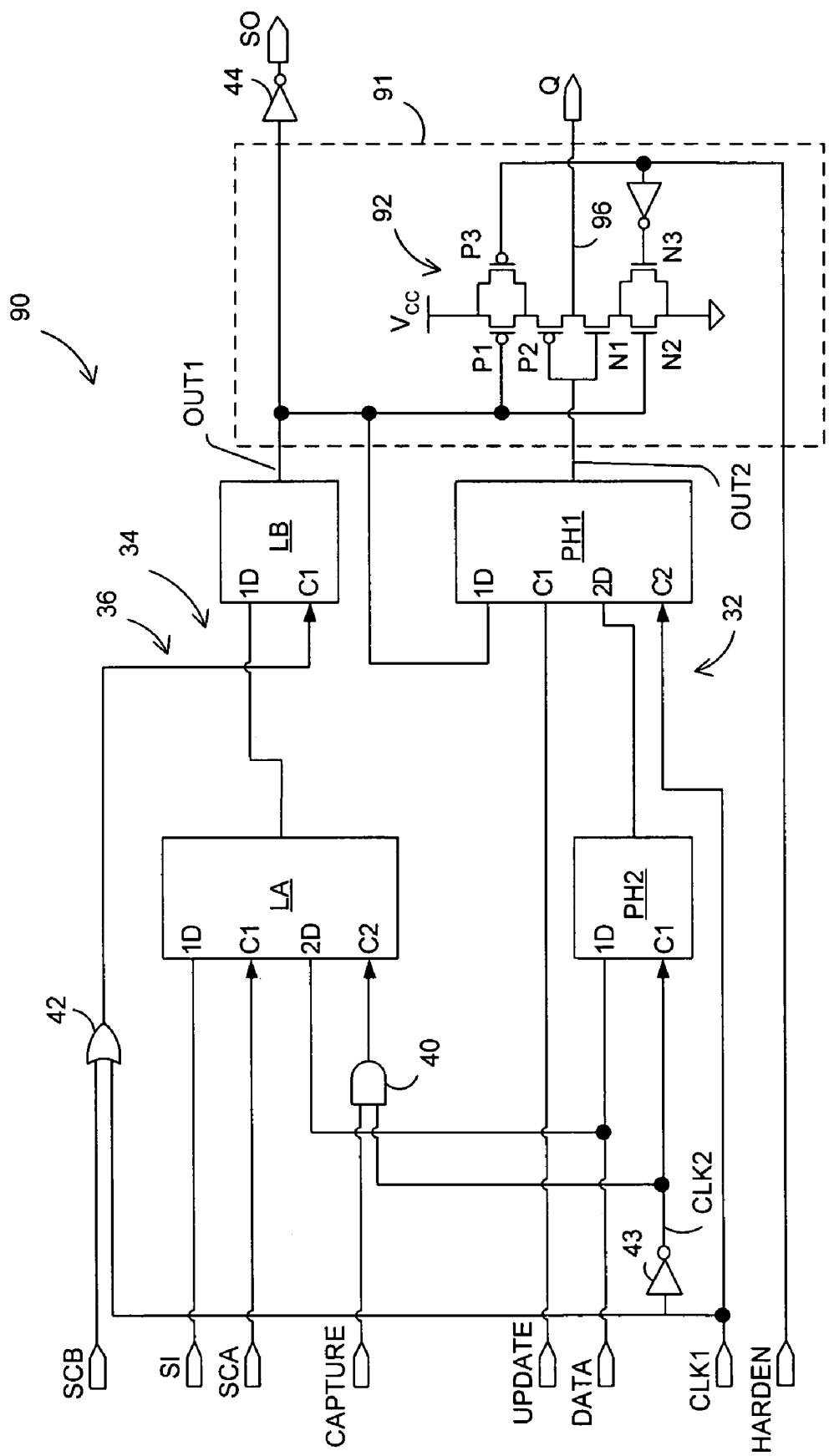
FIG. 13 is a circuit schematic of a full-hold scan cell utilizing hardening by C-element (HDC), according to another embodiment of the present invention.

Referring to FIG. 13, each of the scan cells 20 of FIGS. 4 and 5 may take the form of a full-hold scan cell 90 with HDC functionality, according to one scan circuit reuse embodiment of the present invention. Scan cell 90 enhances its resilience to soft errors by reconfiguring the signals in the same manner as shown in FIG. 6, but instead of incorporating hardening by transmission gate (HDT) as undertaken with the previously-discussed embodiments, the scan cell 90 incorporates an output joining circuit 91 which utilizes hardening by a C-element 92 (HDC). Except for the substitution of the C-element 92 for the transmission gate of FIG. 6, the rest of the structure of FIG. 13 remains the same as FIG. 6. Hence, the same reference numbers from FIG. 6 are used for identical components in FIG. 13 and these components are only briefly described again. As with the HDT design of FIG. 6, there is a system flip-flop 32 and a shadow circuit 34 having a shadow flip-flop 36. The shadow circuit 34 may reconfigure the clock signals by adding two logic gates (OR gate 42 and a clock control circuit in the form of an AND gate 40) and may have modified signal routing, such as routing the data input signal DATA to both the system latch PH2 and the shadow latch LA. The data input signal DATA, system clocks CLK1 and CLK2, scan clocks SCA and SCB, scan-in signal SI, signals UPDATE and CAPTURE remain the same. The inverter 45 shown in FIG. 6 may not be needed in the scan cell of FIG. 13; the C-element 92 may perform its function.

Figure 14:
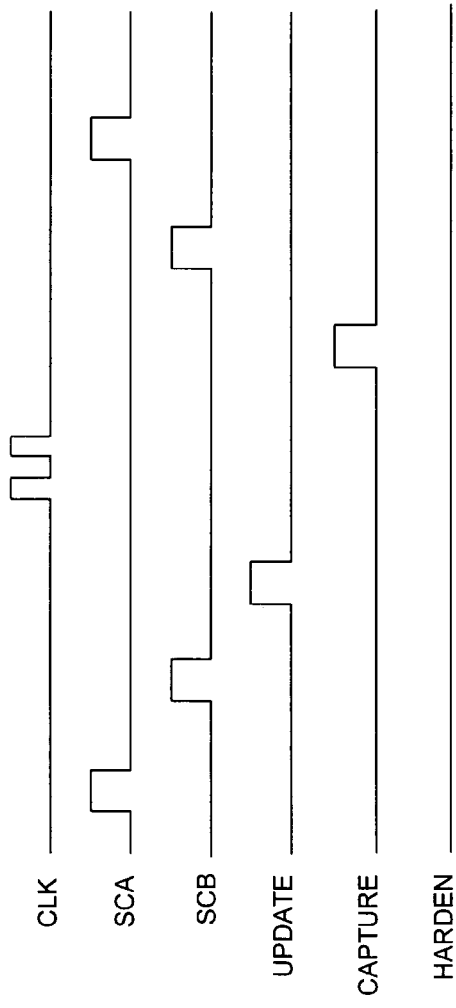
FIG. 14 is a truth table for the full-hold scan cell of FIG. 13.

FIG. 14 shows a truth table 94 for the C-element 92, which is sometimes referred to as a Muller C-element. Referring to FIGS. 13 and 14, the C-element 92 may have as inputs the first and the second output signals OUT1 and OUT2 and may have a data output signal Q. As illustrated in truth table 90, the output of C-element circuit 92 may be high upon both inputs OUT1 and OUT2 being high. The output may be low upon the inputs OUT1 and OUT2 being low. That is, only when all inputs are logic value "0" will the output of a C-element be a logic value "0", and only when all inputs are logic value "1" will the output be logic value "1". For all other input combinations, the output of the C-element may hold its previous value. Holding the previous value may be what happens when there is a soft error. A signal HARDEN may be coupled to the C-element 92 to enable and disable the C-element 92.

The C-element 92 may include in series two P-channel transistors P1 and P2 and two N-channel transistors N1 and N2. The transistor P1 may have its source coupled to the external supply voltage $V_{CC}$ and its drain coupled to the source of transistor P2. The transistor P2 may have its drain connected to an output node 96 for the output signal Q. The transistor N1 may have its drain coupled to the output node 96 and its source may be connected to the drain of the transistor N2. The transistor N2 may have its source coupled to ground. The gates of transistors N2 and P1 may be commonly coupled to the output OUT1 (biasing voltage) of the flip-flop 36. The gates of transistors N1 and P2 may be commonly coupled to the output OUT2 (biasing voltage) of the flip-flop 32. A P-channel transistor P3 and an N-channel transistor N3 may be coupled in parallel with transistor P1 and transistor N2, respectively, with their gates coupled to the inverted signal HARDEN and non-inverted signal HARDEN, respectively.

Figure 15:
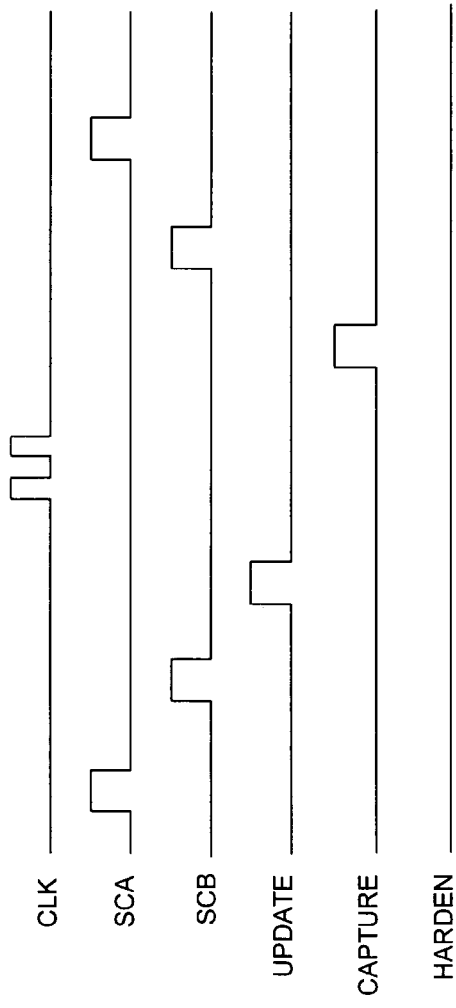
FIG. 15 is a timing diagram for the scan cell of FIG. 13 in its test mode.

The timing diagrams for a test mode, a resistant functional mode, a non-resistant functional mode for the scan cell 90 of FIG. 13 are shown in FIGS. 15, 16, and 17, respectively. The test mode operation shown in FIG. 15 of the scan cell 90 is the same as the prior art scan cell 10 shown in FIG. 1 and the scan cell 30 (using HDT) shown in FIG. 6. In the resistant functional mode shown in FIG. 16, the scan clocks SCA and SCB and the signals UPDATE and HARDEN are forced low, while the CAPTURE signal is forced high. This equivalently converts the shadow circuit 34 into a master-slave shadow flip-flop 36 that works in parallel with the system flip-flop 32. The scan clock signals SCA and SCB and the signal UPDATE remain static during normal system operation of the resistant functional mode. The Q output of the C-element 92 may be actively driven only if the contents of system flip-flop 32 and shadow flip-flop 36 match (OUT1=OUT2). If any latch is erroneous due to a soft error, first output signal OUT1 will not agree with the second output signal OUT2, causing data output signal Q to enter a high-impedance state. Referring to FIG. 17, during the non-resistant functional mode the scan clocks SCA and SCB and the signals UPDATE and CAPTURE may be forced low, while the HARDEN signal may be forced high, in order to save power. It should be noted that the signal line for the signal HARDEN does not pose a significant overhead, because it may be generated from test circuitry, which is already available. Moreover, the signal HARDEN may remain static (either high or low) in any of the three operation modes. Minimal buffering and routing may be used, since there are no strict timing constraints to meet.

Figure 18:
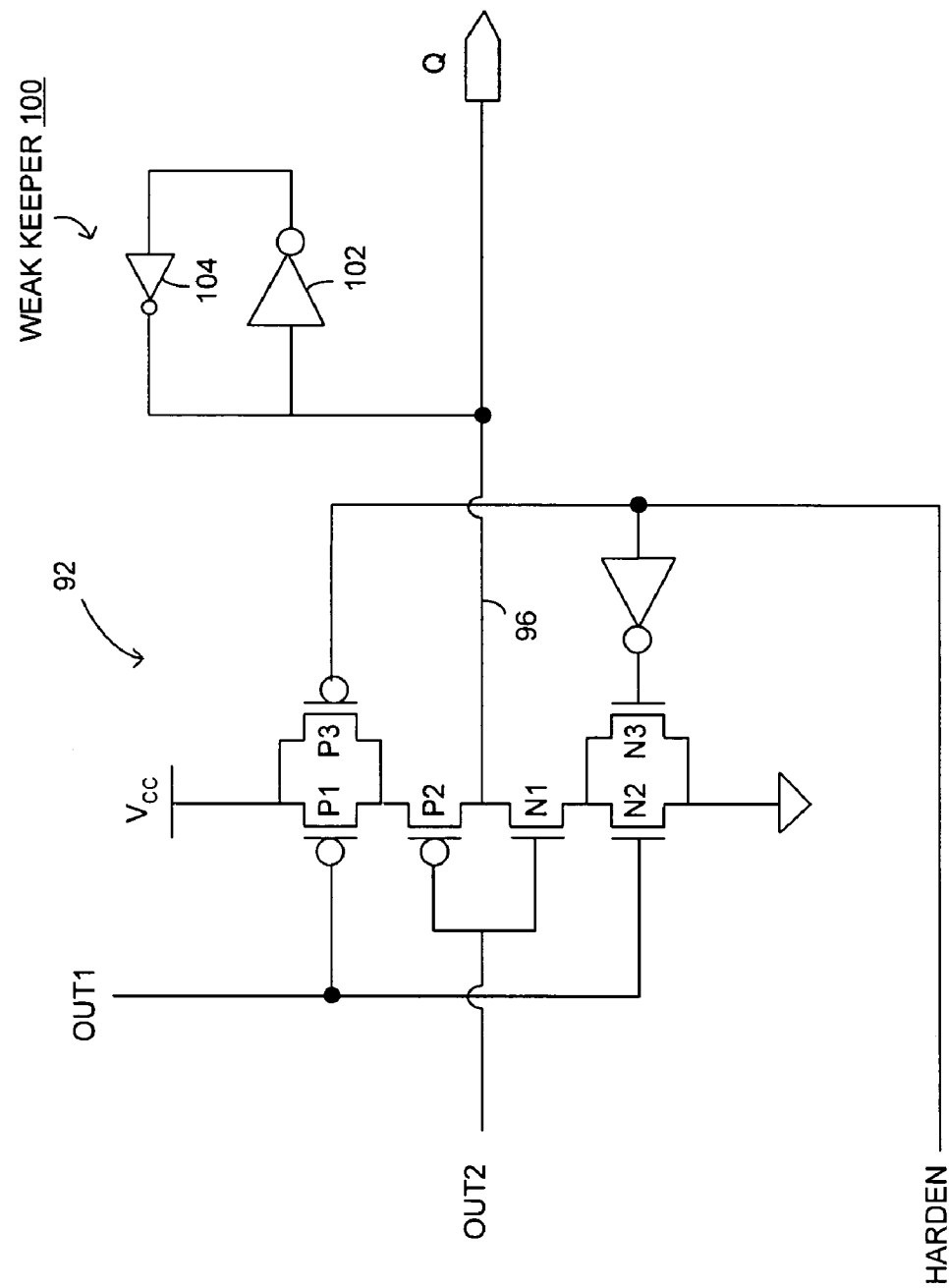
FIG. 18 is a circuit schematic of the C-element of FIG. 17 with a weak keeper circuit.

Referring to FIG. 18, the C-element 92 of FIG. 13 may be modified to include a weak keeper circuit 100, which may include two inverters 102 and 104. Circuit simulations have shown that it takes more than half a nanosecond for charge-sharing and leakage current to change the floating output voltage level (either supply voltage or ground) by approximately 20%. This weak impact of leakage current, combined with the rare occurrence of a particle strike event, poses little problem to contemporary multi-GHz designs which have a cycle time much less than 1 ns. However, system clock may be stopped for a long time if system-level power-saving mode is to be activated in an IC chip. If a particle strikes one of the latches and flips its state, leakage current may end up completely changing the state of output Q given enough time. The weak keeper circuit 100 on the output node 96 may provide a solution to this issue. The addition of the weak keeper circuit 100 does not change the operation of the scan cell 90; hence, the timing diagrams of FIGS. 15-17 remain the same.

In summary, the full-hold scan cell 90 with HDC functionality, according to another scan circuit reuse embodiment of the present invention, may be broadly defined to include the "system circuit" in the form of the system flip-flop 32; the "shadow circuit" 34 having the shadow flip-flop 36 and the interfacing circuits between the flip-flops 32 and 36; and the "output joining circuit" 91 in the form of the C-element 92, with or without the weak keeper circuit 100.

Each of the scan cells 20 of FIGS. 4 and 5 may take the form of a 2-latch scan cell for latch clocking with HDC functionality, according to another scan circuit reuse embodiment of the present invention. More specifically, the two-latch scan cell 60 of FIG. 11 may be modified to include the C-element 92 of FIG. 13, with or without the weak keeper circuit 100 of FIG. 18. To accommodate the inclusion of the C-element 92 of FIG. 13 into the scan cell 60 of FIG. 11, the transmission gate 64 (and the associated signal HARDEN) of FIG. 11 are removed and the C-element 92 of FIG. 13 is substituted in its place. The output Q of the system latch PH of FIG. 11 becomes the second output signal OUT2 of FIG. 13 and the output signal SO of the shadow latch SL of FIG. 11 becomes the first output signal OUT1 of FIG. 13.

Each of the scan cells 20 of FIGS. 4 and 5 may take the form of a 3-latch scan cell with HDC functionality, according to another scan circuit reuse embodiment of the present invention. More specifically, the 3-latch scan cell 70 of FIG. 12 may be modified to include the C-element 92 of FIG. 13, with or without the weak keeper circuit 100 of FIG. 18. To accommodate the inclusion of the C-element 92 of FIG. 13 into the scan cell 70 of FIG. 12, the transmission gate 80 (and the associated signal HARDEN) of FIG. 12 are removed and the C-element 92 of FIG. 13 is substituted in its place. The output Q of the system latch PH of FIG. 12 becomes the second output signal OUT2 of FIG. 13 and the output signal SO of the shadow latch SL of FIG. 12 becomes the first output signal OUT1 of FIG. 13.

Figure 19:
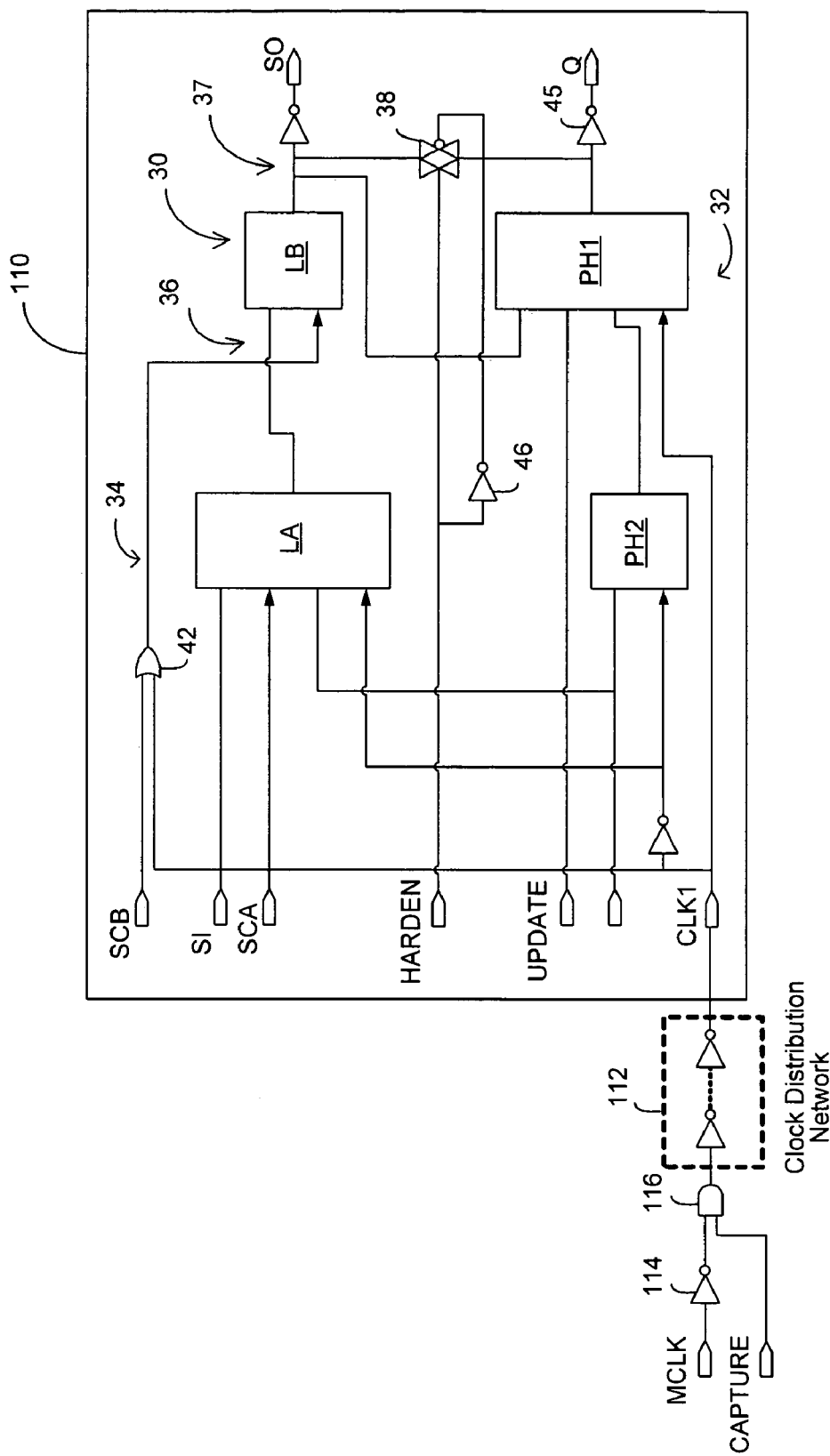
FIG. 19 is a circuit schematic illustrating a signal routing schematic for the scan cells according to the various embodiments of the present invention.

With the exception of the 3-latch scan cell 70 of FIG. 12, the scan cells 20 of FIGS. 4 and 5 describe above inherit a feature of scan clocks and scan signals of conventional scan cell 10 of FIG. 1, which is that the scan clocks SCA and SCB (or scan clock SC), and signals CAPTURE and UPDATE are globally routed and are not timing critical. Referring to FIG. 19, a scan cell 110 is illustrated with simplified signal routing for the signal CAPTURE. Although the scan cell 110 is illustrated by the scan cell 30 of FIG. 6 with HDT functionality (but with the removal of the AND gate 40), the scan cell 110 may also take the form of the full-hold scan cell 50 with HDT functionality of FIG. 10, the 2-latch scan cell 60 of FIG. 11 with HDT functionality, the full-hold scan cell 90 with HDC functionality (with or without the keeper circuit), and the 2 latch scan cell 60 of FIG. 11 with HDC functionality. Each of these scan cells used for scan cell 110 are modified from the way they are previously shown by the removal of the AND gate that received the signal CAPTURE. Note however that the scan cell 110 of FIG. 19 may not be a 3-latch scan cell. For the scan cell 110, the signal CAPTURE may be integrated into a clock distribution network 112, instead of being globally routed. The pin count of the scan cell 110 may be reduced by one, as a result. More specifically, a master clock MCLK may be inverted by the inverter 114 and ANDed with the signal CAPTURE by an AND gate 116. The output of the AND gate 116 may be provided to the network 112. The system clock signal CLK1 may be provided to the scan cell 110 when the signal CAPTURE is high (enabled state for clock signal) and is disabled when the signal CAPTURE is low (disabled state for clock signal).

Figure 20:
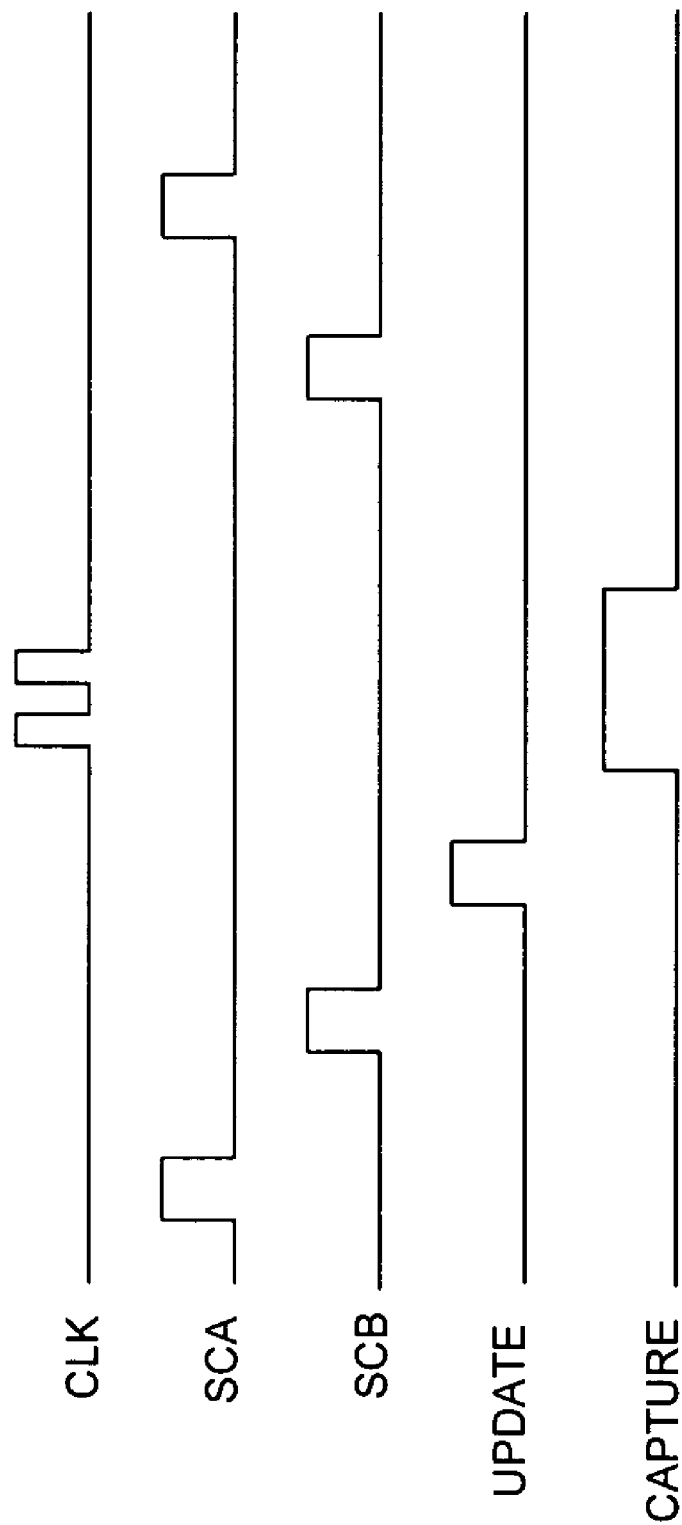
FIG. 20 is a timing diagram for the scan cells utilizing the signal routing schematic shown in FIG. 19.

Referring to FIG. 20, the main difference between scan cell 110 and the previously described scan cells is the CAPTURE waveform in the test mode. The signal CAPTURE remains high when system clock CLK1 is pulsed high during the test mode. In other words, signal CAPTURE and the system clock signal CLK1 overlap in test mode. The signal CAPTURE only switches states in test mode and remains high in the resistant functional mode. The scan cell 110 generates a scan-out signal in response to a scan-in signal and at least one scan clock signal during the test mode of operation when the AND gate is low (system clock disabled). The low-speed nature of the test operation indicates that the signal CAPTURE is not timing-critical. As a result, the clock distribution network 112 of the IC chip (see FIGS. 4 and 5) may be easily modified to ensure sufficient timing margin between the rising/falling edges of signal CAPTURE and the clock signal CLK1 during the test mode. The timing diagram for the signals during the resistant functional mode of operation for each of the various scan cells used for scan cell 110 may be the same as shown with the earlier embodiments. However, the scan cell 110 does not have a non-resistant functional mode because the elimination of the AND gate eliminates the ability to turn off the shadow circuits (such as shadow circuit 34) by asserting a low value for the signal CAPTURE.

Generalizing with respect to the scan circuit reuse subgroup of embodiments (subgroup from the first group of embodiments using the "reuse" concept), scan reuse for soft error protection arises from the realization that there are redundant scan resources which are unused during normal operation, but still occupy IC chip area and consume leakage power during normal system operation. The reuse of the scan cells for hardening may result in the following: (1) reduced area overhead because resources already available for test and debug are reused for soft error resilience; (2) insignificant routing overhead unlike previous prior art techniques requiring global routing of error signals; (3) no or virtually no major architectural changes; and (4) applicability to virtually any digital designs (e.g., microprocessors, network processors, ASICs).

Figure 21:
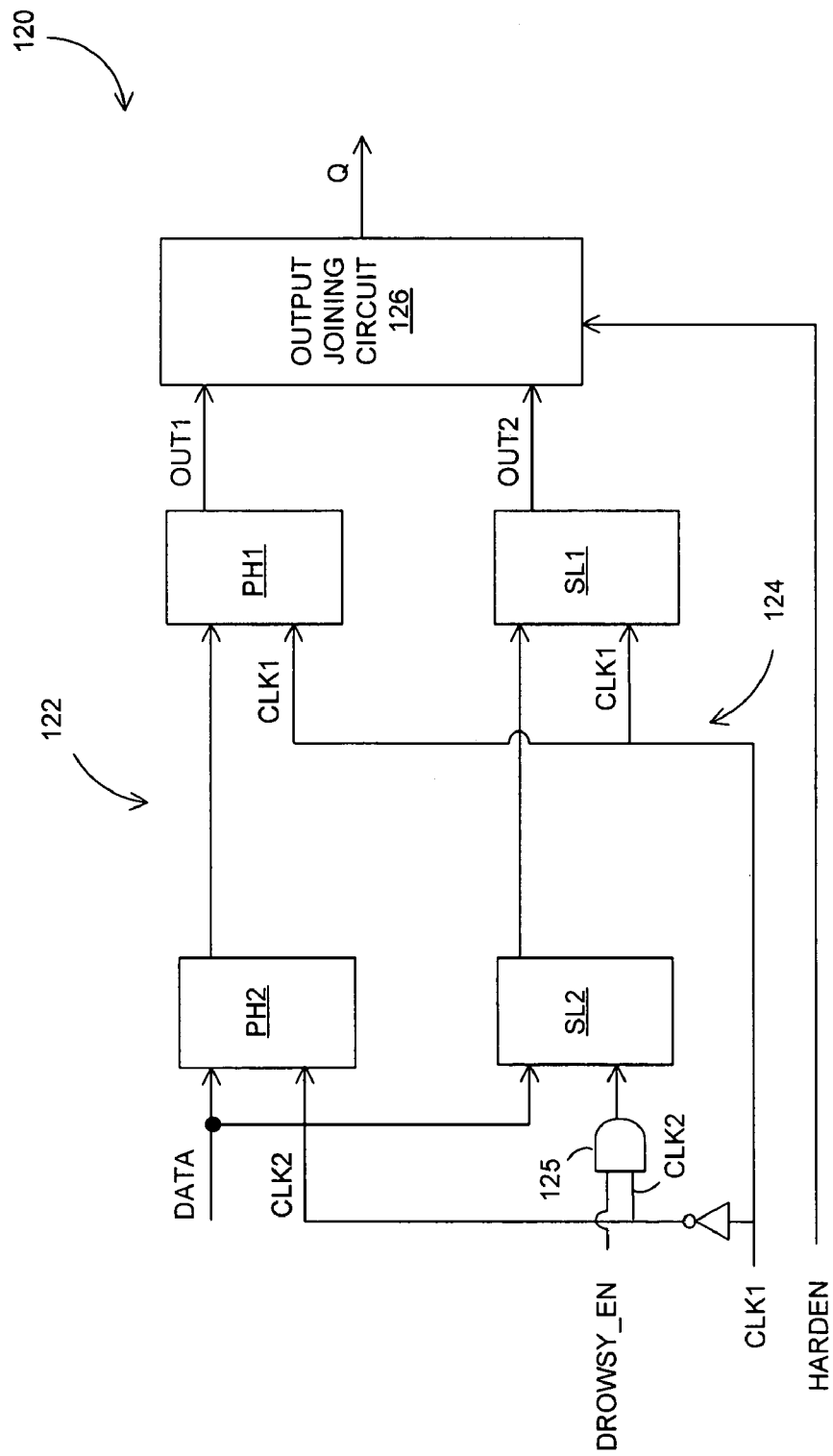
FIG. 21 is a dual flip-flop circuit according to another embodiment of the present invention.
Figure 22:
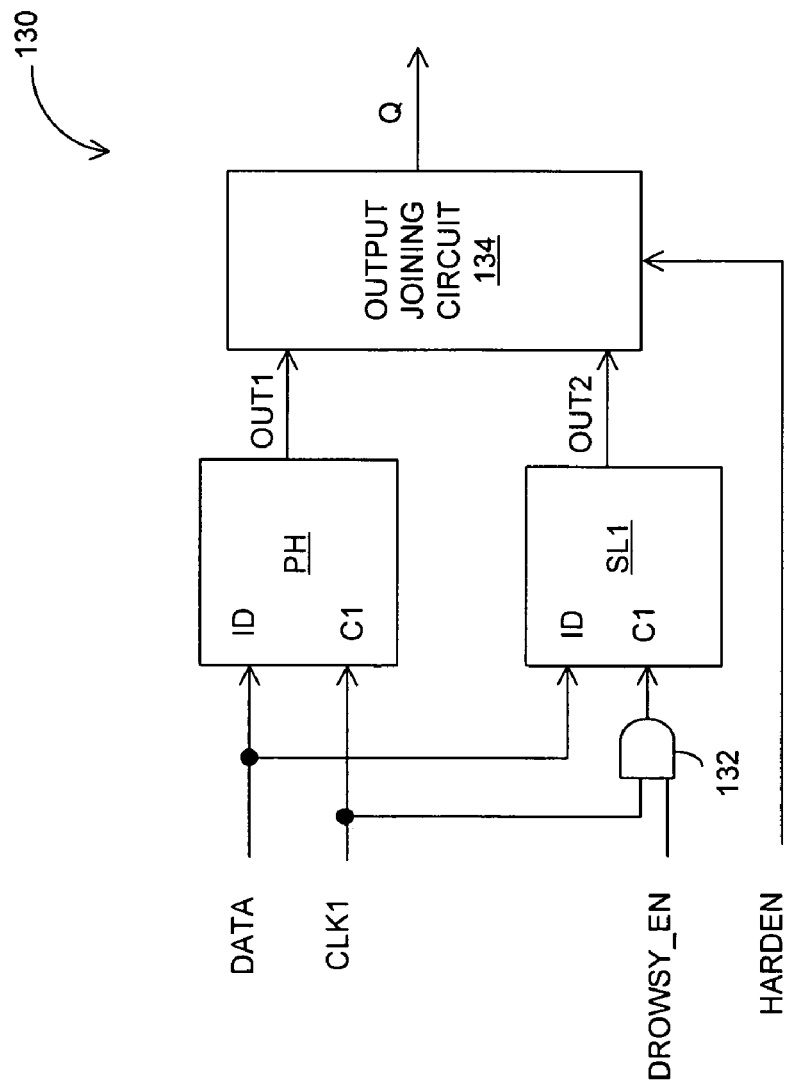
FIG. 22 is a dual latch circuit according to another embodiment of the present invention.

Referring to FIGS. 21 and 22, the second group of embodiments according to the present invention is illustrated, wherein the duplication of the sequential circuits (e.g. two latches or two flip-flops) is undertaken for the purpose of soft error reduction or correction, with the two sequential circuits having their outputs coupled by an output joining circuit that provides hardening from soft errors. In these implementations, reuse of existing circuitry that has been duplicated for other purposes is not available. The resilience against soft errors may be achieved by incorporating one of two hardening approaches into an output joining circuit: hardening by transmission gate (HDT) or hardening by C-element (HDC). Each of the joining circuits has been previously described with respect to the reuse embodiments.

Referring to FIG. 21, a first hardened circuit may take the form of a dual flip-flop circuit 120. The dual flip-flop circuit 120 may include a system flip-flop 122 having a first system latch PH2 and a second system latch PH1 and further may include a shadow flip-flop 124 having a first shadow latch SL2 and a second shadow latch SL1. In one embodiment not having a non-resistant functional mode, a data input signal DATA and clock signal CLK2 may be commonly coupled directly to input terminals of the latches PH2 and SL2. In another embodiment having a non-resistant functional mode of operation, the clock signal CLK2 may be coupled to a clock control circuit in the form of an AND gate 125, which will be described hereinafter. The clock signal CLK1 may be commonly coupled to input terminals of the latches PH1 and SL1. The system latches PH2 and PH1 comprise a master latch and a slave latch, respectively, in which the output of the master system latch PH2 is the input of the slave system latch PH1, and the output of the slave system latch PH1 provides the first output signal OUT1 of the system flip-flop 122. Likewise, the shadow latches SL2 and SL1 comprise a master latch and a slave latch, respectively, in which the output of the master shadow latch SL2 is the input of the slave shadow latch SL1, and the output of the slave shadow latch SL1 provides a second output signal OUT2 of the shadow flip-flop 124. As illustrated, the flip-flops 122 and 124 are positive edge-triggered flip-flops; however, they may negative edge-triggered flip-flops, as described with respect to the scan cell 30 of FIG. 6. The first and second output signals OUT1 and OUT2 of the slave latches PH1 and SL1, respectively, may be provided to an output joining circuit 126. The output joining circuit 126 may take the form of the output joining circuit 37 (transmission gate 38) of FIG. 6; the output joining circuit 56 of FIG. 10 (transmission gates 38, 52, with transmission gate 52 being coupled between the outputs of the two master latches PH1 and SL2); or the output joining circuit 91 (C-element 92) of FIG. 13 with or without the weak keeper circuit 100 of FIG. 18. The output joining circuit 126 may provide a data output signal Q with resilience against soft errors.

Referring to FIG. 22, a second hardened circuit may take the form of a dual latch circuit 130. The dual latch circuit 130 may include a system latch PH and a shadow latch SL. As illustrated, the latches PH and SL are positive level-sensitive latches; however, they may be negative level-sensitive latches. In one embodiment not having a non-resistant functional mode, a data input signal DATA and clock signal CLK1 may be commonly coupled directly to input terminals of the latches PH and SL. In another embodiment having a non-resistant functional mode of operation, the clock signal CLK2 may be coupled to a clock control circuit in the form of an AND gate 132, which will be described hereinafter. The first and second output signals OUT1 and OUT2 of the latches PH and SL, respectively, may be provided to an output joining circuit 134. The output joining circuit 134 may take the form of the output joining circuit 62 (transmission gate 64) of FIG. 11; or the output joining circuit 91 (C-element 92) of FIG. 13 with or without the weak keeper circuit 100 of FIG. 18. The output joining circuit 134 may provide a data output signal Q with resilience against soft errors.

Referring to FIGS. 21 and 22, as described above, in one embodiment the hardened circuits 120 and 130 may have the system and shadow circuits always activated during normal operation to provide resilience against errors; hence, there is no non-resistant functional mode, only a resistant mode of operation. In another embodiment, the hardened circuits 120 and 130 may have two modes of operation: a resistant functional mode of operation (first functional mode of operation) with added resilience against soft errors and a non-resistant functional mode of operation (second functional mode of operation) without added resilience against software errors but with reduced power consumption. To achieve the non-resistant functional mode, the clocking of the shadow circuits may be block by disabling the clock signal CLK2 and the output joining circuits may be disabled from coupling together the first and second outputs of the system and the shadow circuits, respectively. More specifically, when the circuits 120 and 130 are in the resistant functional mode, the output joining circuits 126 or 134 is in an enabled state wherein the outputs are coupled and when in the non-resistant functional mode of operation, the joining circuits 126 and 134 are in a disabled state wherein the outputs are decoupled, as previously described in detail with respect to the reuse scan embodiments. Briefly, in the embodiments wherein the output joining circuits 126 or 134 includes one or more transmission gates, the HARDEN signal when high may cause the transmission gate(s) to couple the two outputs together during the resistant functional mode of operation and when low may cause the transmission gate(s) to be open during the non-resistant functional mode of operation to save power. Likewise, the signal HARDEN may couple and decouple the outputs via the C-element. When the circuits 120 and 130 are in the resistant functional mode, the clock control circuit (AND gates 125 and 132) enable clocking of the shadow circuits by clock signals CLK2 (enable signal DROWSY_EN is high) and during the non-resistant functional mode, the AND gates 125 and 132 disable clocking of the shadow circuits by the signals CLK2 (signal DROWSY_EN is low).

In another embodiment of the present invention, a third hardened circuit may be formed by modifying the 3-latch scan cell of FIG. 12 to create a non-scan 3-latch circuit having a resistant and a non-resistant functional mode of operation, but no test mode of operation. In comparison to FIG. 12, the latch SL is intentionally added instead of being reused. Additionally, the signal UPDATE is eliminated and the signal CAPTURE may be renamed as signal DROWSY_EN, to agree with FIGS. 22 and 23. Again, this design only provides soft error protection during one clock phase, as described earlier with respect to FIG. 12. The 3-latch circuit may take many different forms with FIG. 12 illustrating just one such form.

Figure 23:
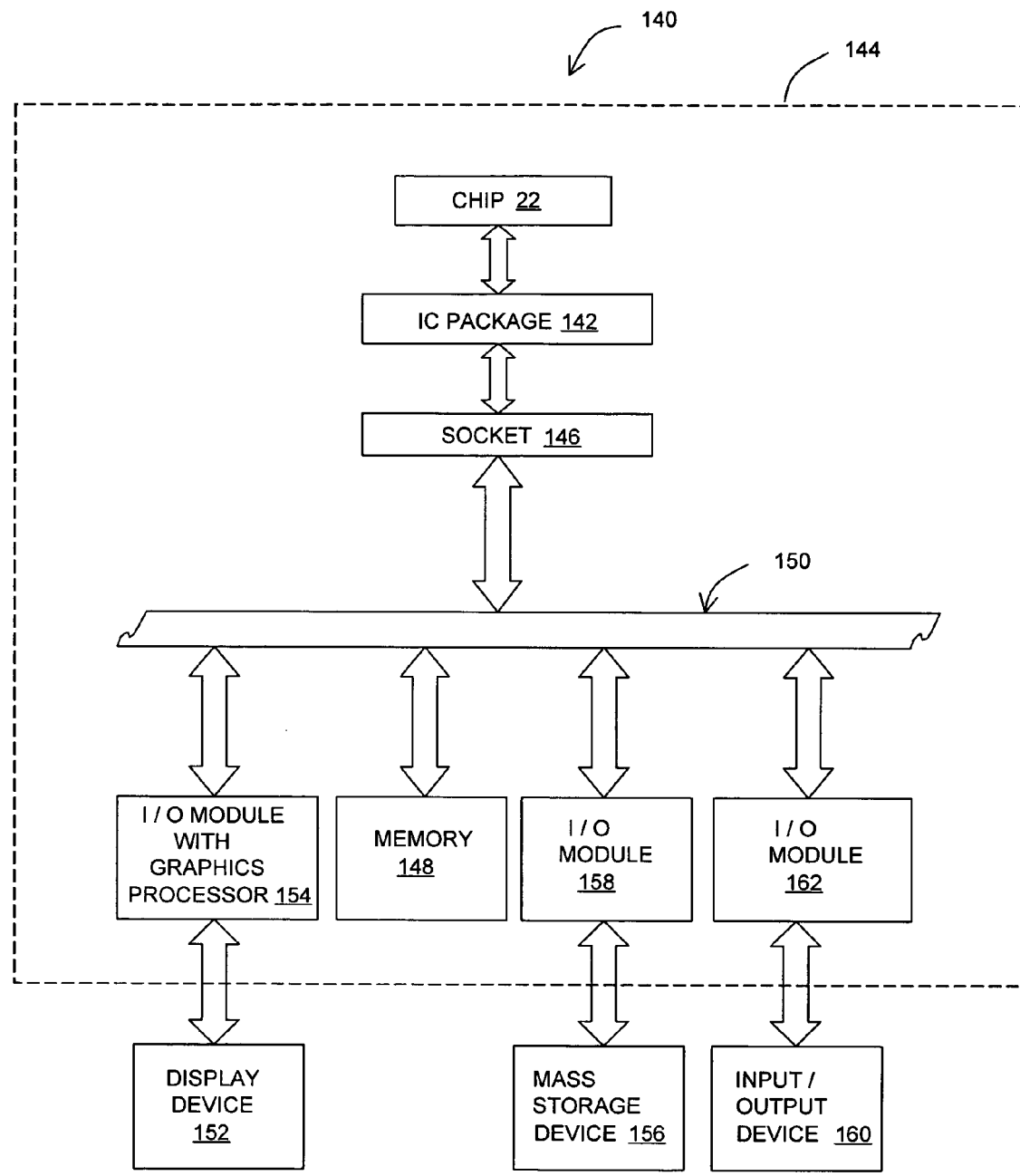
FIG. 23 is a system incorporating the various scan cells and dual sequential circuits according to the various embodiments of the present invention.

Referring to FIG. 23, there is illustrated a system 140, which is one of many possible systems in which an IC package 142 may be used, which includes the IC chip 22 of FIGS. 4 and 5. However, the various embodiments of the present invention are applicable to systems other than computer systems, and the computer system 140 is merely illustrative of one application. The IC chip 22 may include the scan cells 20, which may take many different forms, as described above. The IC chip 22 may also include dual sequential circuits 120 or 130. In the system 140, the IC package 142 is mounted on a substrate or printed circuit board (PCB) 144 via a socket 146. The IC chip 22 of the IC package 142 may be a processor and the PCB 144 may be a motherboard. In addition to the socket 146 and the IC package 142, the PCB 144 may have mounted thereon a main memory 148 and a plurality of input/output (I/O) modules for external devices or external buses, all coupled to each other by a bus system 150 on the PCB 144. More specifically, the system 140 may include a display device 152 coupled to the bus system 150 by way of an I/O module 154, with the I/O module 154 having a graphical processor and a memory. The I/O module 154 may be mounted on the PCB 144 or may be mounted on a separate expansion board. The system 140 may further include a mass storage device 156 coupled to the bus system 150 via an I/O module 158. Another I/O device 160 may be coupled to the bus system 150 via an I/O module 162. Additional I/O modules may be included for other external or peripheral devices or external buses. Examples of the main memory 148 include, but are not limited to, static random access memory (SRAM) and dynamic random access memory (DRAM). Examples of the mass storage device 156 include, but are not limited to, a hard disk drive, a compact disk drive (CD), a digital versatile disk driver (DVD), a floppy diskette, a tape system and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   a system circuit including a first output terminal and adapted to generate at the first output terminal a first output signal in response to a data input signal and at least one system clock signal;
   a shadow circuit including a second output terminal and adapted to generate at the second output terminal a second output signal in response to the data input signal and the at least one system clock signal, with the shadow circuit including at least a duplicate of the system circuit: and
   an output joining circuit coupled to at least the first output terminal and the second output terminal, with the output joining circuit being a selected one of at least one transmission gate or a C-element.

2. The apparatus according to claim 1, further comprising:
   a system clock source adapted to generate the at least one system clock signal; and
   a data source adapted to generate the data input signal; and wherein the system circuit further includes a first data and a first clock input terminal; the shadow circuit includes a second data and a second clock input terminal; the first and the second data input terminals are commonly coupled to the data source to receive the data input signal; and the first and the second clock input terminals are commonly coupled to the system clock source to receive the at least one system clock signal.

3. The apparatus according to claim 2, wherein the shadow circuit further includes a clock control circuit coupled between the system clock source and the second clock input terminal of the shadow circuit, the clock control circuit having an clock enabled state wherein the at least one clock signal is coupled to the shadow circuit during a first functional mode of operation and a clock disabled state wherein the at least one clock signal is decoupled from the shadow circuit during a second functional mode of operation.

4. The apparatus according to claim 1, wherein the system circuit further includes a system latch and the shadow circuit further includes a shadow latch.

5. The apparatus according to claim 1, wherein the output joining circuit includes the at least one transmission gate.

6. The apparatus according to claim 1, wherein the output joining circuit includes the C-element.

7. The apparatus according to claim 6, wherein the C-element has an output node on which a data output signal is generated; and the output joining circuit further includes a weak keeper circuit coupled to the output node of the C-element.

8. The apparatus according to claim 1, wherein the system circuit further includes a system flip-flop having a master system latch and a slave system latch coupled to the master system latch; and the shadow circuit further includes a shadow flip-flop having a master shadow latch and a slave shadow latch coupled to the master shadow latch.

9. The apparatus according to claim 8, wherein the first and the second output terminals are a first pair of output terminals of the slave system latch and the slave shadow latch; the output joining circuit includes a first transmission gate coupled to the first pair of output terminals; and the output joining circuit further includes a second transmission gate coupled to a second pair of output terminals of the master system latch and the master shadow latch.

10. The apparatus according to claim 1, wherein the output joining circuit is adapted to be selectable in coupling the first and the second output terminals during a first functional mode of operation or uncoupling the first and the second output terminals from each other during a second functional mode of operation.

11. The apparatus according to claim 10, wherein the shadow circuit further includes a clock control circuit coupled between the system clock source and the second clock input terminal of the shadow circuit, the clock control circuit having an clock enabled state wherein the at least one clock signal is coupled to the shadow circuit during the first functional mode of operation and a clock disabled state wherein the at least one clock signal is decoupled from the shadow circuit during the second functional mode of operation.

12. The apparatus according to claim 1, wherein the shadow circuit is a scan circuit coupled to the system circuit; the system and the scan circuits are adapted to generate the first and the second output signals, respectively, during a first functional mode of operation; and the scan circuit is further adapted to generate a scan-out signal in response to a scan-in signal and at least one scan clock signal during a test mode of operation.

13. The apparatus according to claim 12, wherein the shadow circuit further includes a clock control circuit coupled between the system clock source and the second clock input terminal of the scan circuit, the clock control circuit having a clock enabled state wherein the at least one clock signal is coupled to the scan circuit during the first functional mode of operation and a clock disabled state wherein the at least one clock signal is decoupled from the scan circuit during the test mode of operation.

14. The apparatus according to claim 13, wherein the output joining circuit has a coupling enabled state wherein the output joining circuit is configured to couple together the first and the second output terminals during the first functional mode of operation and a coupling disabled state wherein the output joining circuit is configured to decouple the first and the second output terminals during the test mode of operation, with the output joining circuit being adapted to be selectable in selecting the coupling enable state or the coupling disabled state.

15. The apparatus according to claim 14, wherein the apparatus has a second functional mode wherein the output joining circuit is in the coupling disable state; and the clock control circuit is in the clock disabling state.

16. The apparatus according to claim 15, wherein the second output terminal of the scan circuit is coupled to a test input terminal of the system circuit; the scan and the system circuits, during the test mode of operation, are adapted to shift the scan-out signal from the second output terminal into the system circuit in response to the at least one scan clock signal and an update signal; and the scan circuit is further adapted to latch a system response received from the data source at the second data input terminal of the scan circuit in response to the at least one system clock signal.

17. The apparatus according to claim 12, wherein the at least one system clock signal includes a first system clock signal and a second system clock signal; the system circuit includes a system flip-flop having a first system latch to generate a first system latch output signal in response to the data input signal and the first system clock signal; wherein the system flip-flop further includes a second system latch, coupled to the first system latch, to generate the first output signal in response to the first system latch output signal and the second system clock signal; wherein the scan circuit includes a shadow flip-flop having a first shadow latch to generate a first shadow latch data output signal in response to the data input signal and the first system clock signal during the first functional mode of operation and to generate a first shadow latch test output signal in response to a scan-in signal and a first scan clock signal; and wherein the shadow flip-flop further includes a second shadow latch to generate the second output signal in response to the first shadow latch data output signal and the second system clock signal during the first functional mode of operation and to generate the scan-out signal in response to the first shadow latch test output signal and a second scan clock signal during the test mode of operation.

18. A method, comprising:
coupling together a first data input terminal of a system circuit and a second data input terminal of a shadow circuit to commonly receive a data input signal, with the system circuit including at least one system latch and the shadow circuit including at least one shadow latch which is a duplicate of the at least one system latch;
generating a first output signal from the system circuit in response to the data input signal and at least one system clock signal;
generating a second output signal from a shadow circuit in response the data input signal and the at least one system clock signal; and
joining together the first and the second output terminals with an output joining circuit, with the output joining circuit being a selected one of at least one transmission gate or a C-element.

19. The method according to claim 18, wherein the joining together of the first and the second output terminals includes selectively enabling the joining together of the first and the second output terminals during a first functional mode of operation and disabling the joining together of the first and the second output terminals during a second functional mode of operation.

20. The method according to claim 19, further comprising:
disabling the at least one system clock system signal to the shadow circuit during the second functional mode of operation.

21. The method according to claim 18, wherein the shadow circuit is a scan circuit.

22. The method according to claim 21, further comprises:
disabling the joining together of the first and the second output terminals during a second functional mode of operation; and
disabling the at least one system clock signal to the shadow circuit during the second functional mode of operation.

23. A system, comprising:
a chip including a plurality of scan cells; a system clock source adapted to generate at least one system clock signal; a logic gate having a first input coupled to the system clock source to receive the at least one system clock signal and a second input coupled to a capture signal, the logic gate having an output of the at least one system clock signal when enabled by the capture signal; and a clock distribution network coupled between the logic gate and the scan cells to provide the at least one system clock signal; and each of the scan cells including a system circuit adapted to generate at a first output terminal a first output signal in response to a data input signal and the at least one system clock signal; a scan circuit including at least a duplicate of the system circuit and adapted to generate at a second output terminal a second output signal in response the data input signal and the at least one system clock signal during a functional mode of operation when the logic gate is enabled, to shift in a scan-in signal in response to at least one scan clock signal when the logic gate is disabled during a test mode of operation, and to apply the scan-in signal to the second output terminal in response to the at least one system clock signal when the logic gate is enabled during the test mode of operation; and an output joining circuit coupled to at least the first output terminal and the second output terminal to generate a data output signal during the funtional mode of operation, with the output joining circuit being a selected one of at least one transmission gate or a C-element.

24. The system according to claim 23, further comprising an integrated circuit package including the chip; a bus with the integrated circuit package coupled thereto; and a mass storage device coupled to the bus.

25. The system according to claim 23, further comprising a data source adapted to generate the data input signal; wherein the system circuit includes a first data and a first clock input terminal; the scan circuit includes a second data and a second clock input terminal; the first and the second data input terminals are commonly coupled to the data source to receive the data input signal; and the first and the second clock input terminals are commonly coupled to the clock distribution network to receive the at least one system clock signal; and wherein the logic gate is an AND gate.

26. The system according to claim 23, wherein the scan circuit is further adapted to shift in a system response signal in response to the at least one scan clock signal when the logic gate is disabled during the test mode of operation, with the logic gate being disabled when the capture signal does not enable the logic gate.

* * * * *

UNITED STATES PATENT AND TRADEMARK OFFICE
CERTIFICATE OF CORRECTION

PATENT NO. : 7,278,074 B2 Page 1 of 1
APPLICATION NO. : 11/044826
DATED : October 2, 2007
INVENTOR(S) : Subhasish et al.

It is certified that error appears in the above-identified patent and that said Letters Patent is hereby corrected as shown below:

Column 18
Line 40, "...the coupling enable state..." should read --...the coupling enabled state...--.

Column 18
Line 44, "...the coupling disable state;..." should read --...the coupling disabled state;...--.

Column 19
Line 24, "...in response the data..." should read --...in response to the data...--.

Signed and Sealed this

Second Day of February, 2010

David J. Kappos
*Director of the United States Patent and Trademark Office*